US008852391B2

(12) United States Patent
McCutcheon et al.

(10) Patent No.: US 8,852,391 B2
(45) Date of Patent: Oct. 7, 2014

(54) METHOD AND APPARATUS FOR REMOVING A REVERSIBLY MOUNTED DEVICE WAFER FROM A CARRIER SUBSTRATE

(75) Inventors: Jeremy W. McCutcheon, Rolla, MO (US); Robert D. Brown, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 281 days.

(21) Appl. No.: 12/819,680

(22) Filed: Jun. 21, 2010

(65) Prior Publication Data
US 2011/0308739 A1 Dec. 22, 2011

(51) Int. Cl.
*B32B 38/10* (2006.01)
*H01L 21/683* (2006.01)
*H01L 21/18* (2006.01)
*H01L 21/687* (2006.01)
*H01L 21/67* (2006.01)

(52) U.S. Cl.
CPC ....... *H01L 21/187* (2013.01); *H01L 2221/6834* (2013.01); *H01L 2221/68318* (2013.01); *H01L 21/6835* (2013.01); *H01L 2221/68386* (2013.01); *H01L 2221/68381* (2013.01); *H01L 21/68721* (2013.01); *H01L 21/67092* (2013.01); *Y10S 156/93* (2013.01); *Y10S 156/941* (2013.01)
USPC ............ 156/714; 156/764; 156/930; 156/941

(58) Field of Classification Search
CPC .......... H01L 2221/68318; H01L 2221/68381; H01L 2221/68386; H01L 2221/6839; H01L 2221/6835
USPC .......... 156/714, 764, 930, 941; 438/455, 458; 29/239
See application file for complete search history.

(56) References Cited

U.S. PATENT DOCUMENTS

| 3,970,494 A | 7/1976 | Pritchard |
| 4,474,942 A | 10/1984 | Sano et al. |
| 4,558,114 A | 12/1985 | Goel |
| 4,710,542 A | 12/1987 | Forgione et al. |
| 4,855,170 A | 8/1989 | Darvell et al. |
| 5,043,250 A | 8/1991 | West et al. |

(Continued)

FOREIGN PATENT DOCUMENTS

| DE | 19628393 | 1/1998 |
| DE | 101 21 115 | 10/2002 |

(Continued)

OTHER PUBLICATIONS

Buna EP T 6250, Lanxess, Lanxess Deutschland GmbH, Business Unit Technical Rubber Products, Product Data Sheet.

(Continued)

*Primary Examiner* — Mark A Osele
(74) *Attorney, Agent, or Firm* — Hovey Williams LLP

(57) ABSTRACT

New demounting methods and apparatuses for separating temporarily, permanently, or semi-permanently bonded substrates and articles formed from those methods and apparatuses are provided. The methods comprise demounting a device wafer from a carrier wafer or substrate that have only been strongly bonded at their outer perimeters. The edge bonds are chemically, mechanically, acoustically, or thermally softened, dissolved, or disrupted to allow the wafers to be easily separated with very low forces and at or near room temperature at the appropriate stage in the fabrication process. A clamp for facilitating separation of the bonded substrates is also provided.

32 Claims, 11 Drawing Sheets

(56) References Cited

U.S. PATENT DOCUMENTS

| | | | |
|---|---|---|---|
| 5,195,729 A | 3/1993 | Thomas et al. | |
| 5,654,226 A | 8/1997 | Temple et al. | |
| 5,897,743 A | 4/1999 | Fujimoto et al. | |
| 6,054,363 A | 4/2000 | Sakaguchi | |
| 6,110,999 A | 8/2000 | Ourth et al. | |
| 6,214,702 B1 | 4/2001 | Kim | |
| 6,235,818 B1 | 5/2001 | Morizono et al. | |
| 6,342,434 B1 | 1/2002 | Miyamoto et al. | |
| 6,343,784 B1 | 2/2002 | Jourde et al. | |
| 6,468,879 B1 | 10/2002 | Lamure et al. | |
| 6,589,855 B2 | 7/2003 | Miyamoto et al. | |
| 6,821,376 B1* | 11/2004 | Rayssac et al. | 156/701 |
| 6,869,894 B2 | 3/2005 | Moore | |
| 6,918,735 B2 | 7/2005 | Urban et al. | |
| 7,084,201 B2 | 8/2006 | Garfield et al. | |
| 7,098,152 B2 | 8/2006 | Moore | |
| 7,187,162 B2* | 3/2007 | Kerdiles et al. | 324/756.07 |
| 7,713,369 B2 | 5/2010 | Aspar et al. | |
| 8,245,754 B2* | 8/2012 | Fujita et al. | 156/764 |
| 8,420,500 B2* | 4/2013 | Soulier-Bouchet et al. | 438/455 |
| 2002/0042666 A1 | 4/2002 | Bacchi et al. | |
| 2002/0061642 A1 | 5/2002 | Haji et al. | |
| 2002/0115263 A1 | 8/2002 | Worth et al. | |
| 2002/0137859 A1 | 9/2002 | Yokota et al. | |
| 2002/0146903 A1 | 10/2002 | Locke et al. | |
| 2003/0118685 A1 | 6/2003 | Takita | |
| 2003/0149207 A1 | 8/2003 | Walter et al. | |
| 2003/0168158 A1 | 9/2003 | Kato | |
| 2003/0224151 A1 | 12/2003 | Mitchell et al. | |
| 2004/0185187 A1 | 9/2004 | Yokoyama et al. | |
| 2004/0213994 A1 | 10/2004 | Kozakai et al. | |
| 2004/0260021 A1 | 12/2004 | Macedo et al. | |
| 2004/0266947 A1 | 12/2004 | Macedo et al. | |
| 2005/0000636 A1 | 1/2005 | Geiger et al. | |
| 2005/0014347 A1 | 1/2005 | Tomita et al. | |
| 2005/0029224 A1 | 2/2005 | Aspar et al. | |
| 2005/0070072 A1* | 3/2005 | Priewasser | 438/460 |
| 2005/0150597 A1* | 7/2005 | Henley et al. | 156/344 |
| 2005/0155704 A1 | 7/2005 | Yokajty et al. | |
| 2005/0164509 A1 | 7/2005 | Koshimizu et al. | |
| 2005/0173064 A1 | 8/2005 | Miyanari | |
| 2005/0181579 A1 | 8/2005 | Thallner | |
| 2005/0191779 A1 | 9/2005 | Le Vaillant et al. | |
| 2005/0221598 A1 | 10/2005 | Lu et al. | |
| 2006/0003165 A1 | 1/2006 | Akatsuka et al. | |
| 2006/0183269 A1 | 8/2006 | Fuergut et al. | |
| 2006/0202220 A1 | 9/2006 | Hayashi | |
| 2006/0286769 A1* | 12/2006 | Tsuchiya et al. | 438/458 |
| 2007/0062644 A1 | 3/2007 | Nakamura et al. | |
| 2007/0117351 A1 | 5/2007 | Bradl et al. | |
| 2007/0145602 A1 | 6/2007 | Yang | |
| 2007/0155129 A1* | 7/2007 | Thallner | 438/455 |
| 2007/0185310 A1 | 8/2007 | Moore et al. | |
| 2007/0267972 A1 | 11/2007 | Menegus et al. | |
| 2007/0274871 A1 | 11/2007 | Jiang | |
| 2008/0173970 A1 | 7/2008 | Pillalamarri | |
| 2008/0200011 A1 | 8/2008 | Pillalamarri et al. | |
| 2008/0213079 A1 | 9/2008 | Herter et al. | |
| 2008/0305721 A1* | 12/2008 | Ohashi et al. | 451/41 |
| 2009/0218560 A1 | 9/2009 | Flaim et al. | |
| 2009/0305617 A1 | 12/2009 | Nakamura et al. | |
| 2009/0314430 A1 | 12/2009 | Nakamura | |

FOREIGN PATENT DOCUMENTS

| | | |
|---|---|---|
| EP | 0 133 357 | 7/1988 |
| EP | 0 849 788 | 6/1998 |
| EP | 1 021 070 | 7/2000 |
| EP | 1 496 547 | 1/2005 |
| EP | 1 681 713 | 7/2006 |
| EP | 1 700 896 | 9/2006 |
| FR | 2783970 | 3/2000 |
| JP | 4074794 | 3/1992 |
| JP | 06-045436 | 2/1994 |
| JP | 07240355 | 9/1995 |
| JP | 08107049 A | 4/1996 |
| JP | 2002-237516 | 8/2002 |
| JP | 2002-531942 | 9/2002 |
| JP | 2004186256 A | 7/2004 |
| JP | 2004253612 A | 9/2004 |
| JP | 2005268690 | 9/2005 |
| JP | 2007-242552 | 9/2007 |
| JP | 2008-171934 | 7/2008 |
| KR | 1020000019536 | 4/2000 |
| RU | 2273075 | 3/2006 |
| SU | 290495 | 11/1971 |
| WO | WO 9106587 | 5/1991 |
| WO | WO 9910925 | 3/1999 |
| WO | 2004006296 | 1/2004 |
| WO | 2005101459 | 10/2005 |
| WO | WO2006093639 | 9/2006 |
| WO | 2008003502 | 1/2008 |
| WO | WO 2008007454 | 1/2008 |
| WO | 2008093408 | 8/2008 |

OTHER PUBLICATIONS

Eastman, Eastotac, http://www.eastman.com/brands/eastotac/producthome.asp?product=71016204.

Eastman, Product Data Sheet, Eastotac Resin H-142W, http://eastman.com/productcatalogapps/pagecontrollers/proddatasheet_PC.aspx?.

F. Niklaus et al., "Adhesive Wafer Bonding," J. Appl. Phys., 2006, 99, 031101.

J. Moore et al., "High Temperature Resistant Adhesive for Wafer Thinning and Backside Processing," ManTech 2004, 8.10, 4 pages.

C. Brubaker et al., "Advances in Processing of Compound Semiconductor Substrates," ManTech 2005, 4 pages.

S. Combe et al., "Reversible Wafer Bonding: Challenges in Ramping up 150mm GaAs Wafer Production to Meet Growing Demand," ManTech 2006, 4 pages.

Y. Kwon et al., "An Evaluation Process of Polymeric Adhesive Wafer Bonding for Vertical System Integration," Japanese Journal of Applied Physics, vol. 44, No. 6A, 2005, pp. 3893-3902.

Technical DataSheet Abstract Ebecryl 168, UCB Chemicals, Additive, Adhesion promoter/Bonding agent, 2006 SpecialChem S.A., 1 page http://www.specialchem4coatings.com/common/pc/product/displayproduct.aspx? id=12887&srchid=220571.

MatWeb, The Online Materials Database: Zeon Chemicals Zeonex 480R Cyclo Olefin Optical Grade Polymer; Subcategory: Cyclo Olefin Polymer, Polymer, Thermoplastic, 2006, 1 page http://www.matweb.com/search/SpecificMaterialPrint.asp?bassnum=PZEON6.

Frank Niklaus, Adhesive Wafer Bonding Technology, Department of Signals, Sensors and Systems, Royal Institute of Technology (KTH), Stockholm, Sweden, Copyright 2002, 33 pages.

Grunsven et al., "Wafer Level Chip Size Packaging Technology for Power Devices Using Low Ohmic Through-Hole Vias," 14th European Microelectronics and Packaging Conference and Exhibition, Germany, Jun. 23-25 2003, pp. 46-50.

Fukushima et al., "New Three-Dimensional Integration Technology Using Chip-to-Wafer Bonding to Archive Ultimate Super-Chip Integration," The Japan Society of Applied Physics, vol. 43, Mo. 4B, 2006, 3030-3035.

Library 4 Science, Pinene, 2006, 1 page, http://www.chromatography-online org/topics/pinene.html.

Technical DataSheet Abstract Vanax 808 HP, R.T. Vanderbilt, Additive, Crosslinking Catalyst/Accelerator/Initiator Amine or Nitrogen Content, 2006 SpecialChem S.A., 2006, 1 page http://www.specialchem4polymers.com/common/pa/product/displayproduct.aspx?id=7815&srchid=292522.

Ciba Specialty Chemicals, Additives, Polymer Additives, Ciba IRGANOX 1010, Phenolic Primary Antioxidant for Processing and Long-Term Thermal Stabilization, Oct. 1999, 2 pages.

Ciba Specialty Chemicals, Additives, Polymer Additives, Ciba IRGAFOS 168, Hydrolytically Stable Phosphite Processing Stabilizer, Sep. 1999, 2 pages.

Chemical Land 21, Organic Chemicals, Mesitylene, 1 page.

D-limonene. A data sheet from the Compendium of Pesticide Common Names, 1 page.

(56) References Cited

OTHER PUBLICATIONS

Safety (MSDS) data for Triton X-100, 1 page.
ExxonMobil Chemical Vistalon, Vistalon 2504 Specifications, 2005, 1 page.
Material Safety Data Sheet, ExxonMobil Chemical Company, Vistalon Ethylene Propylene Rubber, Apr. 14, 2005, 1 page.
IDES, The Plastics Web, Zeonex 480R, 1 page, 2006, http://www.ides.com/grades/ds/E40300.htm.
Eastman Product Data Sheet, Eastotack H-142W Resin, Sep. 13, 2006, 2 pages, http://www.eastman.com/ProductCatalogApps/PageControllers/ProdDatasheet_PC.aspx?p . . .
Eastman H-142 Resin, Application Uses and Key Attributes, Sep. 13, 2006, 1 page http://www.eastman.com/products/producthome.asp-?product=71016204&SelectorUrl=%2 . . .
www.sigma-aldrich.com, 457531 Poly -a-pinene, Sep. 13, 2006, http://www.sigmaaldrich.com/catalog/search/ProductDetail/ALDRICH/457531?PrtPrv=1 . . .
Office action dated Jan. 18, 2011 in related U.S. Appl. No. 12/358,951, filed Jan. 23, 2009.
Office Action dated Jul. 24, 2012 in related U.S. Appl. No. 12/358,951, filed Jan. 23, 2009.
Office Action dated Feb. 2, 2011 in related U.S. Appl. No. 12/951,530, filed Nov. 22, 2010.
Rivas et al., "Thermal Degradation of Copolymers Based on 2-Substituted Oxazoline and B-Methylhyrdrogenitaconate," 1994, Polymer Bulletin, vol. 33, pp. 97-101.
Boustedt et al., "Flip Chip as an Enabler for MEMS Packaging," 2002, 2002 IEEE Electronics Components and Technology Conference, pp. 124-128.
Watanabe et al., "Three-Component Negative Photosensitive Polyimide Precursor Based on Poly(amic acid), a Crosslinker, and a Photoacid Generator," 2004, Journal of Polymer Science: Part A: Polymer Chemistry, vol. 43, pp. 593-599.
Frump, "Oxazolines, Their Preparation, reactions, and applications," 1971, Chem. Rev., vol. 71 (5), pp. 483-505.
J. Dalvi-Malhotra et al., "Use of silane-based primer on silicon wafers to enhance adhesion of edge-protective coatings during wet etching: Application of the TALON Wrap™ process," 2007, Proceedings of SPIE, vol. 6462, pp. 64620B-1-64620B-7.
Hong et al., "High-temperature adhesives for temporary wafer bonding using a sliding approach," IMAPS 2007: Proceedings of the International Microelectronics and Packaging Society 40th International Symposium on Microelectronics, Nov. 11-15, 2007, pp. 1035-1040.
3M Wafer Support System, Products Brochure, 2005, 3M, www.3m.com/electronics, 4 pages.
Kessel et al., "Wafer Thinning with the 3M Wafer Support System," 6 pages.
Pillalamarri et al., "High-Temperature Spin-on Adhesives for Temporary Wafer Bonding," IMAPS 2006: Proceedings of the International Microelectronics and Packaging Society 39th International Symposium on Microelectronics, Oct. 8-12, 2006, pp. 105-111.
Puligadda et al., "High-Performance Temporary Adhesives for Wafer Bonding Applications," Mater. Res. Soc. Symp. Proc., vol. 970, 2007.
Smith et al., "High temperature-resistant spin-on adhesive for temporary wafer mounting using an automated high-throughput tooling solution," Technical Digest, Austin, TX: CS MANTECH conference, May 14-17, 2007, pp. 29-32.
Search Report and Written Opinion dated Jul. 28, 2009 in related PCT/US2009/031862 filed on Jan. 23, 2009.
"3M Introduces New System for Ultrathin Wafer Backgrinding," Business Wire, San Francisco, CA, Jul. 12, 2004, 2 pages.
Garrou, "Temporary Bonding for 3-D IC Thinning and Backside Processing," ECTC 2009 San Diego (posted May 24, 2009), 6 pages.
International Preliminary Report on Patentability dated Aug. 5, 2010 in related PCT/US2009/031862 filed on Jan. 23, 2009.
Office Action dated Feb. 4, 2011 in related Austrian Application No. A 9035/2009.
Office Action dated Feb. 4, 2011 in related Austrian Utility Model Application No. GM 514/2010.
Office Action dated Jul. 6, 2011 in related Chinese Application No. 200980103199.8.
Search Report dated Feb. 8, 2011 in related European Application No. 09703204.9.
Office Action dated Jan. 18, 2011 in related Japanese Application No. 2010-544445.
Office Action dated Aug. 23, 2011 in related Japanese Application No. 2010-544445.
Office Action dated Nov. 1, 2010 in related Korean Application No. 10-2010-7015973.
Office Action dated Feb. 25, 2011 in related Korean Application No. 10-2010-7015973.
Office Action dated Oct. 3, 2011 in related Russian Application No. 2010129076.
International Search Report and Written Opinion dated Aug. 22, 2011 in corresponding PCT/US2010/041726 filed on Jul. 12, 2010.
Office Action dated Jul. 11, 2011 in corresponding Austrian Utility Model Application No. 3A GM 524/2010-1.
Search Report dated Oct. 26, 2010 in corresponding European Application No. 10008731 1.
Search Report dated Jan. 28, 2011 in corresponding European Application No. 10008732.9.
Office Action dated Mar. 2, 2011 in corresponding German Application No. 10 2010 027 703.7.
Office Action dated Jun. 15, 2011 in corresponding Russian Application No. 2010129938/28.
Office Action dated Aug. 10, 2012 in corresponding European Patent Application No. 10008731.1.
Office Action dated Oct. 28, 2010 in related U.S. Appl. No. 12/358,951, filed Jan. 23, 2009.
Office Action dated Nov. 22, 2011, in related Austrian Application No. A 9035/2009.
Office Action dated Apr. 18, 2011, in related U.S. Appl. No. 12/951,530, filed Nov. 22, 2010.
Office Action dated Jan. 4, 2012, in related U.S. Appl. No. 12/951,530, filed Nov. 22, 2010.
Office Action dated Jan. 19, 2012, in related European Application No. 09703204.9.
Search Report dated Mar. 27, 2012 in related Austrian Application No. GM 514/2010.
Office Action dated Apr. 24, 2012 in corresponding Japanese Patent Application No. 2010-183931.
Office Action dated May 3, 2012 in related Chinese Patent Application No. 200980103199.8.
Office Action dated Apr. 16, 2012 in corresponding Korean Patent Application No. 10-2010-0070696.
Office Action dated Mar. 21, 2012 in related Japanese Patent Application No. 2010-544445.
Office Action dated Jun. 20, 2012 in corresponding European Patent Application No. 10008732.9.
Office Action dated Feb. 16, 2014 in corresponding Israeli Patent Application No. 207044.
Office Action dated Jan. 7, 2014 in related Japanese Patent Application No. 2012-162690.
Office Action dated Jan. 28, 2014 in corresponding German Patent Application No. 102010027703.7.

\* cited by examiner

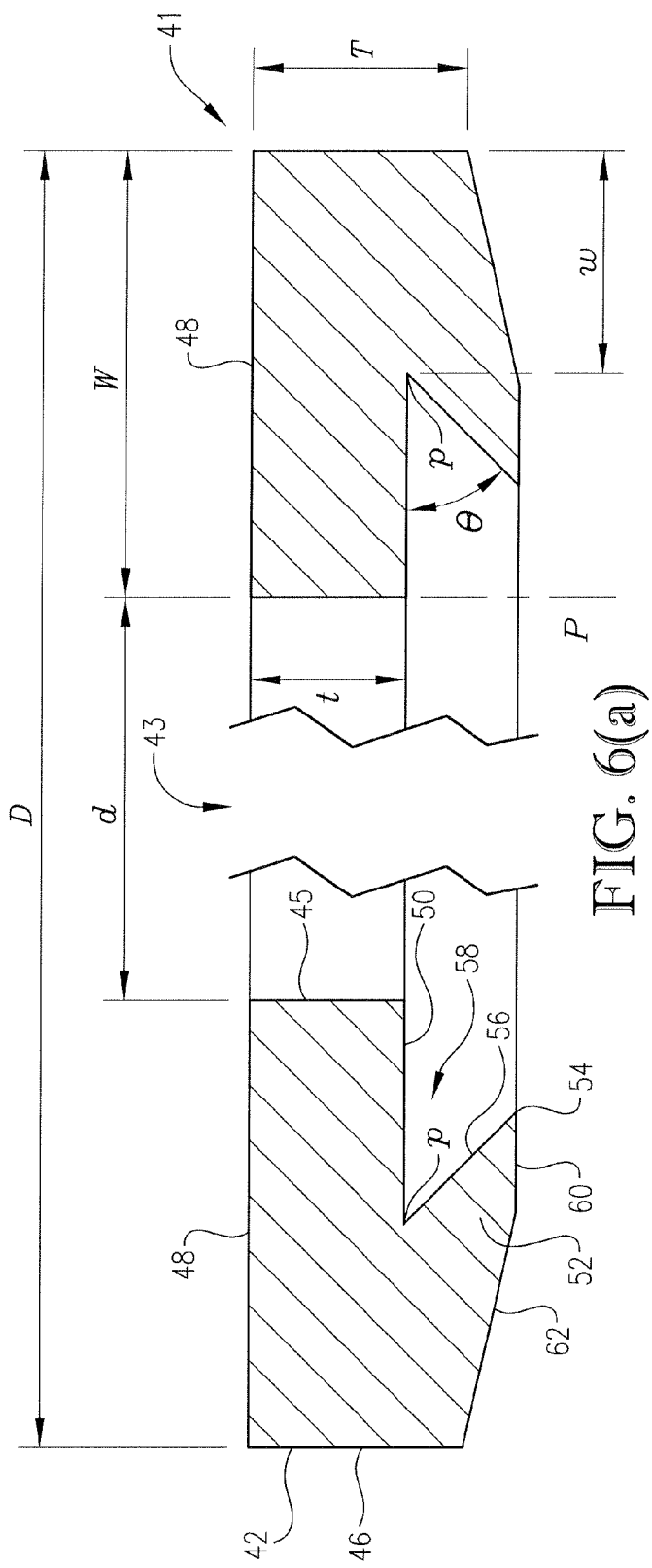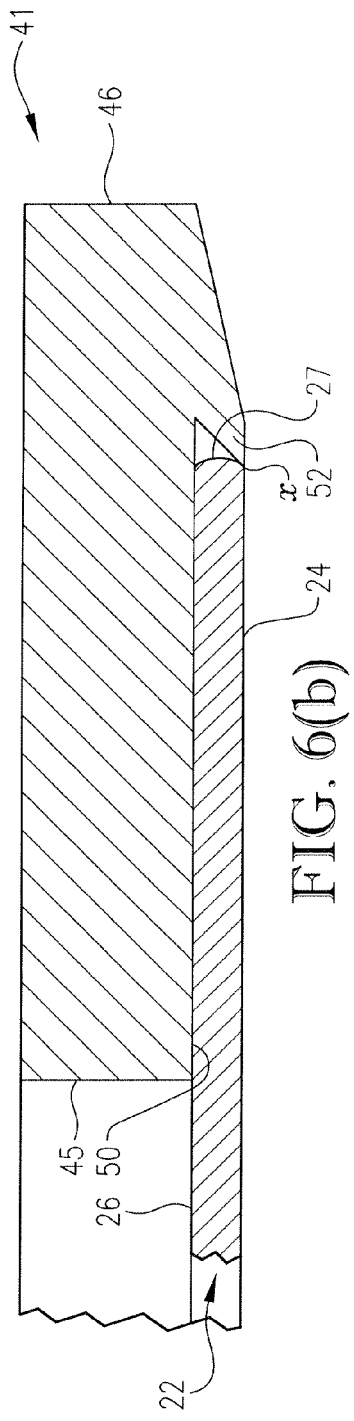
FIG. 6(a)
FIG. 6(b)

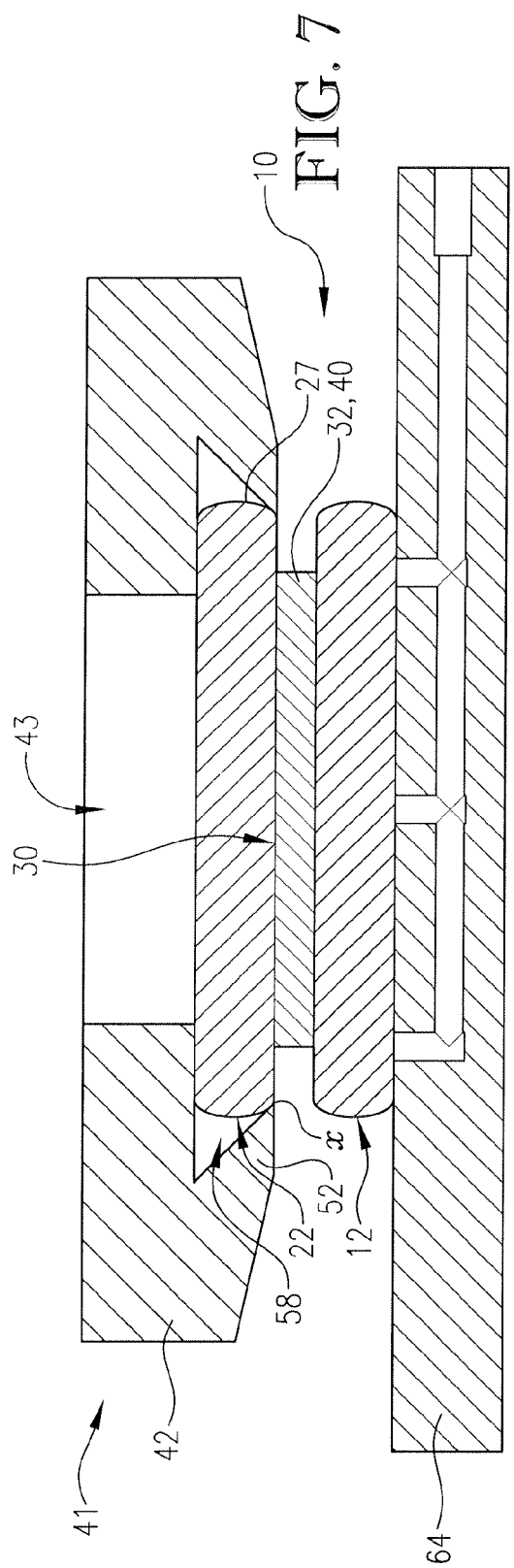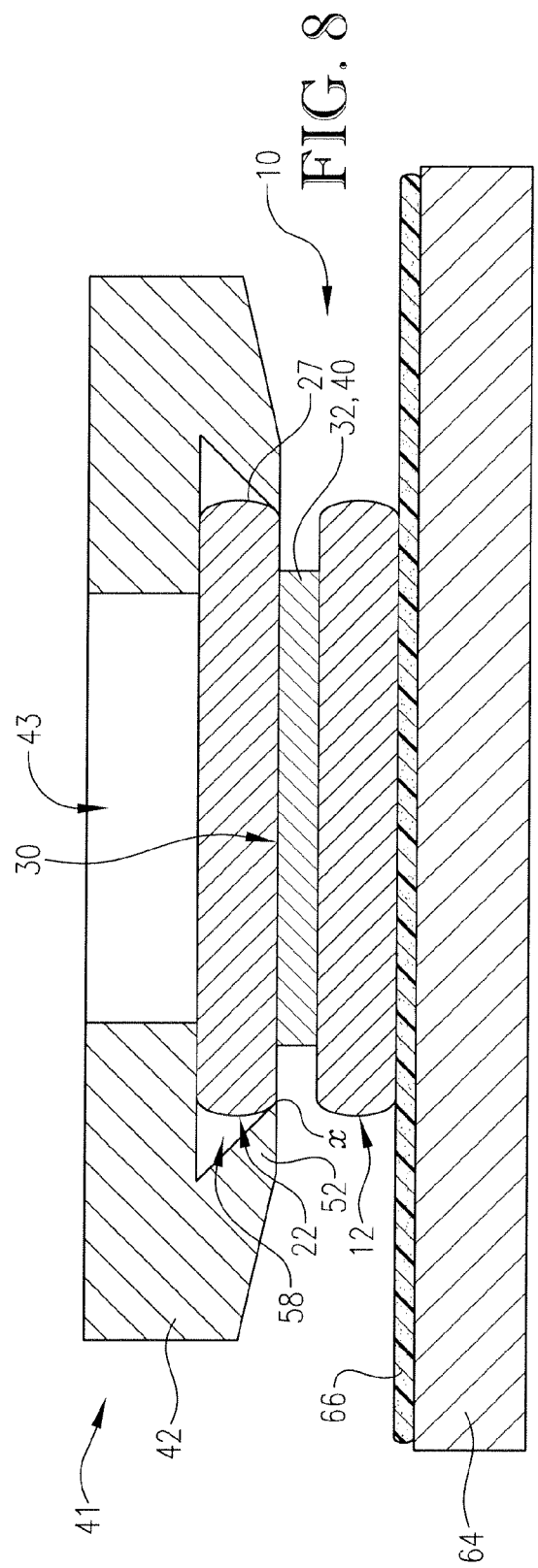

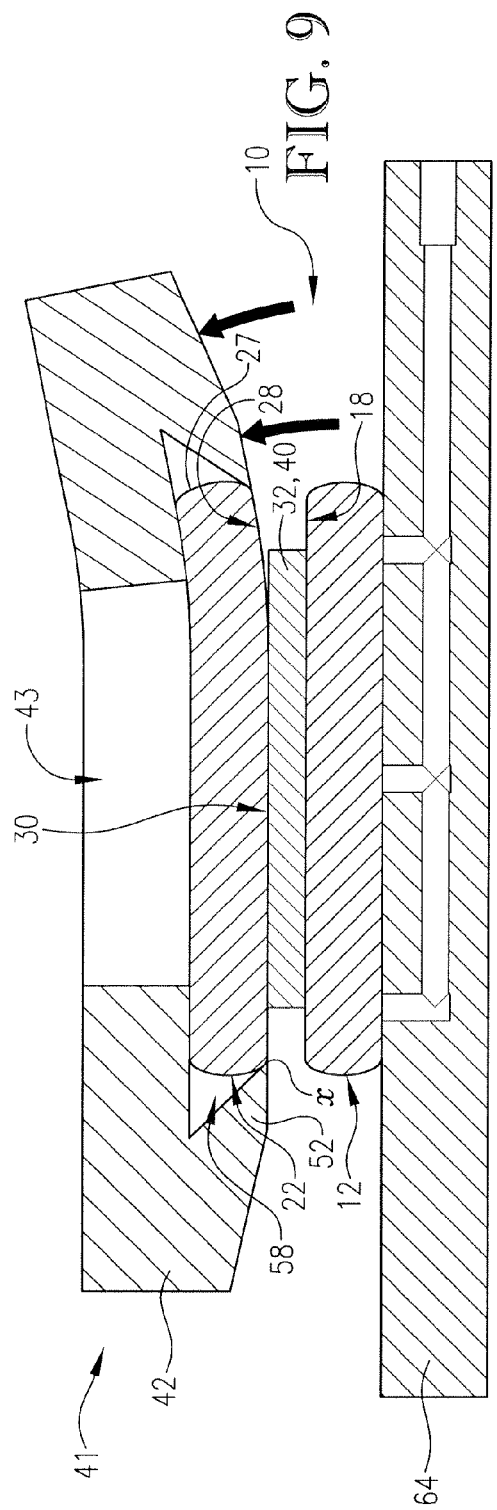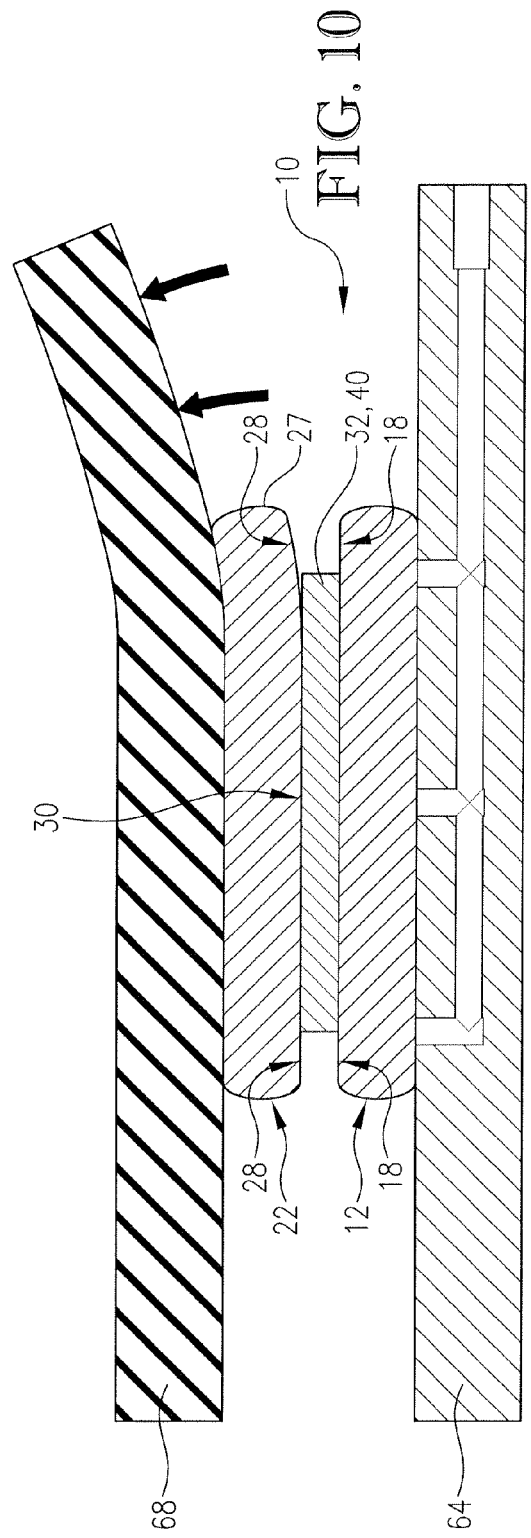

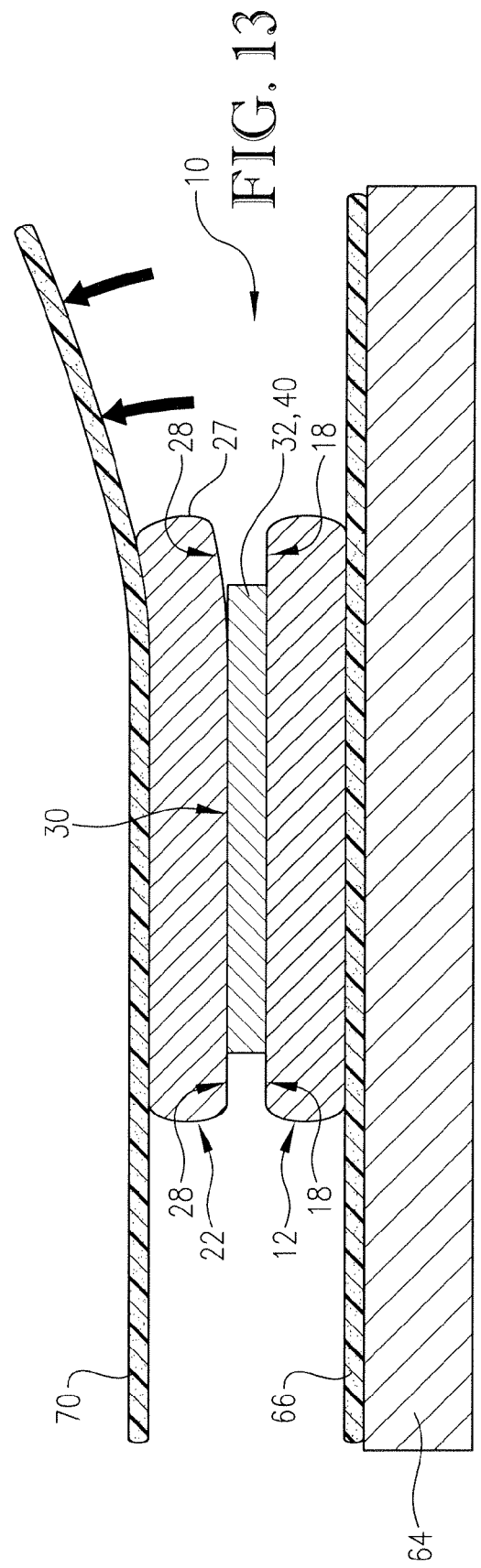

METHOD AND APPARATUS FOR REMOVING A REVERSIBLY MOUNTED DEVICE WAFER FROM A CARRIER SUBSTRATE

BACKGROUND OF THE INVENTION

1. Field of the Invention

The present invention is broadly concerned with novel temporary wafer debonding methods and apparatuses that can remove a device wafer from a carrier substrate after wafer thinning and other backside processing.

2. Description of the Prior Art

Integrated circuits, power semiconductors, light-emitting diodes, photonic circuits, microelectromechanical systems (MEMS), embedded passive arrays, packaging interposers, and a host of other silicon- and compound semiconductor-based microdevices are produced collectively in arrays on wafer substrates ranging from 1-12 inches in diameter. The devices are then separated into individual devices or dies that are packaged to allow practical interfacing with the macroscopic environment, for example, by interconnection with a printed wiring board. It has become increasingly popular to construct the device package on or around the die while it is still part of the wafer array. This practice, which is referred to as wafer-level packaging, reduces overall packaging costs and allows a higher interconnection density to be achieved between the device and its microelectronic environment than with more traditional packages that usually have outside dimensions several times larger than the actual device.

Until recently, interconnection schemes have generally been confined to two dimensions, meaning the electrical connections between the device and the corresponding board or packaging surface to which it is mounted have all been placed in a horizontal, or x-y, plane. The microelectronics industry has now recognized that significant increases in device interconnection density and corresponding reductions in signal delay (as a result of shortening the distance between electrical connection points) can be achieved by stacking and interconnecting devices vertically, that is, in the z-direction. Two common requirements for device stacking are: (1) thinning of the device in the through-wafer direction from the backside; and (2) subsequently forming through-wafer electrical connections, commonly referred to as through-silicon vias or "TSVs," that terminate on the backside of the device. For that matter, semiconductor device thinning has now become a standard practice even when devices are not packaged in a stacked configuration because it facilitates heat dissipation and allows a much smaller form factor to be achieved with compact electronic products such as cellular telephones.

There is growing interest in thinning semiconductor devices to less than 100 microns to reduce their profiles, especially when they or the corresponding packages in which they reside are stacked, and to simplify the formation of backside electrical connections on the devices. Silicon wafers used in high-volume integrated circuit production are typically 200 or 300 mm in diameter and have a through-wafer thickness of about 750 microns. Without thinning, it would be nearly impossible to form backside electrical contacts that connect with front-side circuitry by passing the connections through the wafer. Highly efficient thinning processes for semiconductor-grade silicon and compound semiconductors based on mechanical grinding (backgrinding) and polishing as well as chemical etching are now in commercial use. These processes allow device wafer thickness to be reduced to less than 100 microns in a few minutes while maintaining precise control over cross-wafer thickness uniformity.

Device wafers that have been thinned to less than 100 microns, and especially those thinned to less than 60 microns, are extremely fragile and must be supported over their full dimensions to prevent cracking and breakage. Various wafer wands and chucks have been developed for transferring ultrathin device wafers, but the problem still exists of how to support the wafers during backgrinding and TSV-formation processes that include steps such as chemical-mechanical polishing (CMP), lithography, etching, deposition, annealing, and cleaning, because these steps impose high thermal and mechanical stresses on the device wafer as it is being thinned or after thinning. An increasingly popular approach to ultrathin wafer handling involves mounting the full-thickness device wafer face down to a rigid carrier with a polymeric adhesive. It is then thinned and processed from the backside. The fully processed, ultrathin wafer is then removed, or debonded, from the carrier by thermal, thermomechanical, or chemical processes after the backside processing has been completed.

Common carrier materials include silicon (e.g., a blank device wafer), soda lime glass, borosilicate glass, sapphire, and various metals and ceramics. The carriers may be square or rectangular but are more commonly round and are sized to match the device wafer so that the bonded assembly can be handled in conventional processing tools and cassettes. Sometimes the carriers are perforated to speed the debonding process when a liquid chemical agent is used to dissolve or decompose the polymeric adhesive as the means for release.

The polymeric adhesives used for temporary wafer bonding are typically applied by spin coating or spray coating from solution or laminating as dry-film tapes. Spin- and spray-applied adhesives are increasingly preferred because they form coatings with higher thickness uniformity than tapes can provide. Higher thickness uniformity translates into greater control over cross-wafer thickness uniformity after thinning. The polymeric adhesives exhibit high bonding strength to the device wafer and the carrier.

The polymeric adhesive may be spin-applied onto the device wafer, the carrier, or both, depending on the thickness and coating planarity (flatness) that is required. The coated wafer is baked to remove all of the coating solvent from the polymeric adhesive layer. The coated wafer and carrier are then placed in contact in a heated mechanical press for bonding. Sufficient temperature and pressure are applied to cause the adhesive to flow and fill into the device wafer structural features and achieve intimate contact with all areas of the device wafer and carrier surfaces.

Debonding of a device wafer from the carrier following backside processing is typically performed in one of four ways:

(1) Chemical—The bonded wafer stack is immersed in, or sprayed with, a solvent or chemical agent to dissolve or decompose the polymeric adhesive.

(2) Photodecomposition—The bonded wafer stack is irradiated with a light source through a transparent carrier to photodecompose the adhesive boundary layer that is adjacent to the carrier. The carrier can then be separated from the stack, and the balance of the polymeric adhesive is removed from the device wafer while it is held on a chuck.

(3) Thermomechanical—The bonded wafer stack is heated above the softening temperature of the polymeric adhesive, and the device wafer is then slid or pulled away from the carrier while being supported with a full-wafer holding chuck.

(4) Thermodecomposition—The bonded wafer stack is heated above the decomposition temperature of the polymeric adhesive, causing it to volatilize and lose adhesion to the device wafer and carrier.

Each of these debonding methods has drawbacks that seriously limit its use in a production environment. For example, chemical debonding by dissolving the polymeric adhesive is a slow process because the solvent must diffuse over large distances through the viscous polymer medium to effect release. That is, the solvent must diffuse from the edge of the bonded substrates, or from a perforation in the carrier, into the local region of the adhesive. In either case, the minimum distance required for solvent diffusion and penetration is at least 3-5 mm and can be much more, even with perforations to increase solvent contact with the adhesive layer. Treatment times of several hours, even at elevated temperatures (>60° C.), are usually required for debonding to occur, meaning wafer throughput will be low.

Photodecomposition is likewise a slow process because the entire bonded substrate cannot be exposed at one time. Instead, the exposing light source, which is usually a laser having a beam cross-section of only a few millimeters, must be focused on a small area at a time to deliver sufficient energy for decomposition of the adhesive bond line to occur. The beam is then scanned (or rastered) across the substrate in a serial fashion to debond the entire surface, which leads to long debonding times.

While thermomechanical (TM) debonding can be performed typically in a few minutes, it has other limitations that can reduce device yield. Backside processes for temporarily bonded device wafers often involve working temperatures higher than 200° C. or even 300° C. The polymeric adhesives used for TM debonding must neither decompose nor soften excessively at or near the working temperature, otherwise, debonding would occur prematurely. As a result, the adhesives are normally designed to soften sufficiently at 20-50° C. above the working temperature for debonding to occur. The high temperature required for debonding imposes significant stresses on the bonded pair as a result of thermal expansion. At the same time, the high mechanical force required to move the device wafer away from the carrier by a sliding, lifting, or twisting motion creates additional stress that can cause the device wafer to break or produces damage within the microscopic circuitry of individual devices, which leads to device failure and yield loss.

Thermodecomposition (TD) debonding is also prone to wafer breakage. Gases are produced when the polymeric adhesive is decomposed, and these gases can become trapped between the device wafer and the carrier before the bulk of the adhesive has been removed. The accumulation of trapped gases can cause the thin device wafer to blister and crack or even rupture. Another problem with TD debonding is that polymer decomposition is often accompanied by the formation of intractable, carbonized residues that cannot be removed from the device wafer by common cleaning procedures.

The limitations of these prior art debonding methods for polymeric adhesives have created the need for new modes of carrier-assisted thin wafer handling that provide high wafer throughput and reduce or eliminate the chances for device wafer breakage and internal device damage.

SUMMARY OF THE INVENTION

The present invention broadly provides a novel ring clamp for separating bonded substrates. The ring clamp has a planar body with a substantially circular shape and a central opening. The body comprises an annular interior sidewall; an annular exterior sidewall; a top surface extending between the interior sidewall and the exterior sidewall; a wafer-engaging surface extending from the interior sidewall outwardly in substantially parallel alignment with the top surface, wherein the wafer-engaging surface terminates at a point in the body that is spaced from the exterior sidewall; and an inwardly extending annular ridge, which slopes inward from that point, and away from the wafer-engaging surface. The wafer-engaging surface and annular ridge cooperatively form an annular wafer-receiving groove.

The present invention is also directed toward the combination of a clamp having a planar body with a substantially circular shape, and comprising an annular wafer-receiving groove; and a planar substrate having an outermost edge defining the periphery of the substrate, wherein at least a portion of the periphery is received in the wafer-receiving groove.

The present invention also broadly provides a novel temporary bonding method. The method comprises providing a stack comprising a first substrate and a second substrate bonded to the first substrate and separating the first substrate and second substrate using a peeling motion. The first substrate has a back surface and a device surface, wherein the device surface has a peripheral region and a central region. The second substrate has a carrier surface, a backside surface, and an outermost edge defining the periphery of the second substrate, wherein the carrier surface has a peripheral region and a central region. The first and second substrates are separated by applying a force to a portion of the periphery of the second substrate causing the second substrate to bend at an angle away from the stack, thereby separating the first substrate and second substrate according to the method.

The present invention is also broadly concerned with a method of forming a temporary wafer bonding structure. The method comprises providing a first substrate having front and back surfaces; forming a bonding layer on the front surface of the first substrate; providing a second substrate having front and back surfaces, the front surface having a surface-modified region, a non-modified region, and an optional mask adjacent the non-modified region; and contacting the front surface of the second substrate with the bonding layer on the first substrate to thereby form the temporary bonding structure. Advantageously, the bonding layer and the surface-modified region of the second substrate comprise a low bonding interface therebetween.

The present invention also provides a disc-shaped clamp for separating bonded substrates. The clamp has a solid, planar body with a substantially circular shape. The body comprises an annular exterior sidewall defining the outer diameter of the body; a top surface extending the entire diameter between the exterior sidewall; a wafer-engaging surface extending between a point in the body that is spaced from the exterior sidewall; and an inwardly extending annular ridge, which slopes inward from said point, and away from the wafer-engaging surface. Advantageously, the wafer-engaging surface and annular ridge cooperatively form an annular wafer-receiving groove.

BRIEF DESCRIPTION OF THE DRAWINGS

FIG. 6(a) is a fragmentary cross-sectional view of a ring clamp apparatus taken along section line 6(a) in FIG. 5(a) for separating bonded substrates in accordance with an embodiment of the invention;

FIG. 6(b) is an enlarged cut-away cross-sectional view of the ring clamp from FIG. 6(a) engaging a wafer of a bonded stack according to an embodiment of the invention;

FIG. 7 is a schematic cross-section drawing of an embodiment of the invention utilizing the ring clamp and a vacuum chuck for separation of the bonded substrates;

FIG. 8 is a schematic cross-section drawing of an embodiment of the invention utilizing the ring clamp and an adhesive film-covered chuck for separation of the bonded substrates;

FIG. 9 is a schematic cross-section drawing of an embodiment of the invention depicting the separation process according to the invention;

FIG. 10 is a schematic cross-section drawing of an embodiment of the invention utilizing a flexible chuck and a vacuum chuck for separation of the bonded substrates;

FIG. 13 is a schematic cross-section drawing of an embodiment of the invention utilizing an adhesive film and an adhesive film-covered chuck for separation of the bonded substrates.

DETAILED DESCRIPTION OF THE INVENTION

In more detail, the present invention provides new demounting methods and apparatuses for separating temporarily, permanently, or semi-permanently bonded substrates, such as in a wafer stack, using a peeling motion. As used herein, all references to "peeling," "peeled," or a "peeling motion" refer to the successive detachment of the bonded surface of the substrate being separated beginning at the outermost edge of a portion of the periphery of the substrate and continuing transversely along the substrate surface to the opposite edge/side of the substrate. As used herein, references to "a portion" of the periphery refer to a section of the periphery that is less than the entire periphery (and preferably less than about ½ or less than about ¼ of the periphery), and can include more than one location about the periphery of the substrate where peeling is initiated (preferably 4 or less locations, more preferably 2 or less locations, and even more preferably one location). In general, to peel the substrates apart, an upward force is applied to a portion of the periphery of the substrate causing the substrate to bend and deflect at an angle away from the stack, initially separating the substrate from the stack at that portion of the outermost edge, followed by the successive separation of the substrate from that initial edge to the opposite edge of the substrate until the entire substrate surface has been separated (i.e., peeled away) from the stack. Various methods and apparatuses, including a novel ring clamp, are described in detail below to facilitate this peeling motion, along with several suitable methods of forming the temporarily, permanently, or semi-permanently bonded substrates used in the invention.

Figure 1:
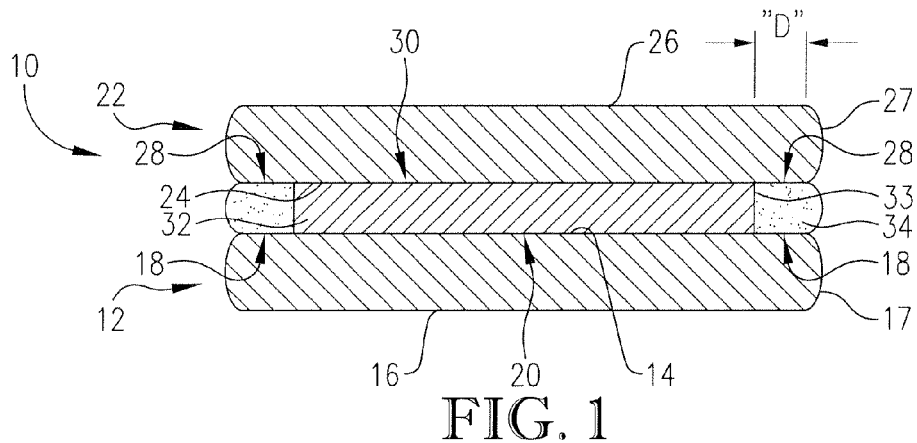
FIG. 1 is a schematic cross-sectional view of a wafer stack.

FIG. 1 depicts one embodiment of a stack 10 of two reversably bonded wafers. Suitable methods of forming such a stack are disclosed in U.S. Patent No. 2009/0218560, filed Jan. 23, 2009, incorporated by reference herein in its entirety to the extent not inconsistent with the present application. It will be appreciated that the order of assembling or applying the components to form the wafer stack 10 will vary, as disclosed in U.S. Patent App. Pub. No. 2009/0218560, and can be performed in any order suitable to achieving the stack 10, as depicted in FIG. 1.

The stack structure 10 includes a first substrate 12. In this embodiment, first substrate 12 is a device wafer. That is, substrate 12 has a front or device surface 14, a back surface 16, and an outermost edge 17 defining the periphery (perimeter) of the substrate. Although substrate 12 can be of any shape, it would typically be circular in shape, although wafer flats can also be used (circular wafers having one or more straight edges on the wafer's outer perimeter). Regardless of the shape, the front or device surface 14 has a peripheral region 18 and a central region 20. The peripheral region 18 preferably has a width of from about 0.05 mm to about 10 mm, more preferably from about 0.5 mm to about 5 mm, and even more preferably from about 1 mm to about 2.5 mm.

Preferred first substrates 12 include device wafers whose device surfaces comprise arrays of devices selected from the group consisting of integrated circuits, MEMS, microsensors, power semiconductors, light-emitting diodes, photonic circuits, interposers, embedded passive devices, and other microdevices fabricated on or from silicon and other semiconducting materials such as silicon-germanium, gallium arsenide, and gallium nitride. The surfaces of these devices commonly comprise structures formed from one or more of the following materials: silicon, polysilicon, silicon dioxide, silicon (oxy)nitride, metals (e.g., copper, aluminum, gold, tungsten, tantalum), low-k dielectrics, polymer dielectrics, and various metal nitrides and silicides. The device surface 14 can also include raised structures such as solder bumps and metal posts and pillars.

The stack 10 also includes a second substrate 22. In this particular embodiment, second substrate 22 is a carrier substrate. Second substrate 22 includes a carrier surface 24 and a back surface 26, and an outer edge 27 defining the periphery of the substrate 22. As was the case with first substrate 12, second substrate 22 can be of any shape, although it would typically be circular in shape and/or have at least one flat. Furthermore, second substrate 22 would preferably be sized to be approximately equal in size to first substrate 12, so that outer edge 27 of second substrate 22 will lie along substantially the same plane as outer edge 17 of first substrate 12. Regardless of the shape, carrier surface 24 has a peripheral region 28 and a central region 30. The peripheral region 28 preferably has a width of from about 0.05 mm to about 10 mm, more preferably from about 0.5 mm to about 5 mm, and even more preferably from about 1 mm to about 2.5 mm.

Preferred second substrates 22 comprise a material selected from the group consisting of silicon, sapphire, quartz, metals (e.g., aluminum, copper, steel), and various glasses and ceramics. Substrate 22 can also include other materials deposited on its surface 24. For example, silicon nitride can be deposited onto a silicon wafer to change the bonding characteristics of the surface 24.

In the intermediate layer between the first substrate 12 and second substrate 22, is a layer 32 of fill material adjacent to the device surface 14 and carrier surface 24, respectively. The thickness of layer 32 (measured at its thickest point) will depend upon the height of the topography on the first substrate 12, and can range between about 5 µm to about 150 µm. In some embodiments, the preferred thickness ranges from about 5 µm to about 100 µm, more preferably from about 5 µm to about 50 µm, and even more preferably from about 10 µm to about 30 µm.

In forming the stack 10, the fill material can be applied to either substrate 12 or substrate 22 via any conventional means, including spin coating, casting from solution (e.g., meniscus coating or roller coating), ink jetting, and spray coating. It is preferred that the fill layer 32 be applied so that it has a thickness (measured at its thickest point) of from about 5 µm to about 100 µm, more preferably from about 5 µm to about 50 µm, and even more preferably from about 10 µm to about 30 µm. When applied via spin coating, the material forming fill layer 32 will typically be spin coated at speeds of from about 100 rpm to about 5,000 rpm for a time period of from about 15 seconds to about 300 seconds. The layer would then be baked near or above the boiling point of the solvent(s) present in the fill layer 32 (e.g., from about 80° C. to about 250° C.) for a time period of from about 1 minute to about 15 minutes to reduce the residual solvent content in fill layer 32 to less than about 1% by weight.

Fill layer 32 is typically formed of a material comprising monomers, oligomers, and/or polymers dispersed or dissolved in a solvent system. If the fill layer 32 will be applied via spin coating, it is preferred that the solids content of this material be from about 1% by weight to about 50% by weight, more preferably from about 5% by weight to about 40% by weight, and even more preferably from about 10% by weight to about 30% by weight. Examples of suitable monomers, oligomers, and/or polymers include those selected from the group consisting of cyclic olefin polymers and copolymers and amorphous fluoropolymers with high atomic fluorine content (greater than about 30% by weight) such as fluorinated siloxane polymers, fluorinated ethylene-propylene copolymers, polymers with pendant perfluoroalkoxy groups, and copolymers of tetrafluoroethylene and 2,2-bis-trifluoromethyl-4,5-difluoro-1,3-dioxole being particular preferred. It will be appreciated that the bonding strength of these materials will depend upon their specific chemical structures and the coating and baking conditions used to apply them.

Examples of suitable solvent systems for cyclic olefin polymers and copolymers include solvents selected from the group consisting of aliphatic solvents such as hexane, decane, dodecane, and dodecene; alkyl-substituted aromatic solvents such as mesitylene; and mixtures thereof. Suitable solvent systems for amorphous fluoropolymers include fluorocarbon solvents sold, for example, by 3M Corporation under the FLUORINERT® label.

In another embodiment, the fill layer 32 could also be formed of a polymeric material that contains dispersed nanoparticles. Suitable nanoparticle materials include those selected from the group consisting of alumina, ceria, titania, silica, zirconia, graphite, and mixtures thereof.

The material of which fill layer 32 is formed should remain stable at temperatures of from about 150° C. to about 350° C., and preferably from about 200° C. to about 300° C. Furthermore, this material should be stable under the chemical exposure conditions encountered in the particular backside processes to which they will be subjected. Fill layer 32 should not decompose (i.e., less than about 1% weight loss) or otherwise lose its mechanical integrity, for example, by melting, under these conditions. The fill layer 32 also should not exhibit outgassing that might cause the thin device wafers to blister or deform, especially when subjected to high-vacuum processes such as during the deposition of CVD dielectric layers.

In this embodiment, the fill layer 32 preferably does not form strong adhesive bonds, thus facilitating separation later. Generally speaking, desirable materials include amorphous polymeric materials that: (1) have low surface free energies; (2) are tack-free and known to not bond strongly to glass, silicon, and metal surfaces (i.e., would typically have very low concentrations of hydroxyl or carboxylic acid groups, and preferably no such groups); (3) can be cast from solution or formed into a thin film for lamination; (4) will flow under typical bonding conditions to fill device wafer surface topography, forming a void-free bond line between substrates; and (5) will not crack, flow, or redistribute under mechanical stresses encountered during backside processing, even when carried out at high temperatures or under high vacuum conditions. As used herein, low surface free energy is defined as a polymeric material or surface that exhibits a contact angle with water of at least about 90° and a critical surface tension of less than about 40 dynes/cm, preferably less than about 30 dynes/cm, and more preferably from about 12 dynes/cm to about 25 dynes/cm, as determined by contact angle measurements.

Low bonding strength refers to polymeric materials or surfaces that do not stick or can be peeled from a substrate with only light hand pressure such as might be used to debond an adhesive note paper. Thus, anything with an adhesion strength of less than about 50 psig, preferably less than about 35 psig, and more preferably from about 1 psig to about 30 psig would be desirable for use as fill layer 32. As used herein, adhesion strength is determined by ASTM D4541/D7234. Examples of suitable polymeric materials exhibiting the above properties include some cyclic olefin polymers and copolymers sold under the names APEL® by Mitsui, TOPAS® by Ticona, and ZEONOR® by Zeon brands, and solvent-soluble fluoropolymers such as CYTOP® polymers sold by Asahi Glass and TEFLON® AF polymers sold by DuPont. The bonding strength of these materials will depend upon the coating and baking conditions used to apply them.

As shown in FIG. 1, the outermost portion of the fill layer 32 has been removed and is only adjacent to the central regions 20 and 30 of the device surface 14 and carrier surface 24, respectively. This can be accomplished by any means that will allow for removal of the desired quantity without damaging the first substrate 12, including dissolving the outermost portion with a solvent that is known to be a good solvent for the material of which fill layer 32 is formed. Examples of such solvents include those selected from the group consisting of aliphatic solvents (e.g., hexane, decane, dodecane, and dodecene), fluorocarbon solvents, and mixtures thereof. After edge removal, the fill layer 32 has an outermost edge 33, which is spaced a distance "D" from the plane defined by the outer edge 17 of the first substrate 12. "D" is typically from about 0.05 mm to about 10 mm, more preferably from about 0.5 mm to about 5 mm, and even more preferably from about 1 mm to about 2.5 mm. Contact with the edge removal solvent can be maintained for a sufficient time to dissolve the desired amount of fill layer 32 to achieve the desired distance "D," but typical contact times would be from about 5 seconds to about 60 seconds.

The outermost portion of the fill layer 32 can be removed either before or after the substrates 12, 22 are bonded in face-to-face relationship with one another. If it is removed before, the stack 10 is formed by contacting the second substrate 22 with the fill layer 32, leaving a void between the peripheral region 18 of the first substrate 12 and the peripheral region 28 of the second substrate 22. This contact is preferably carried out under heat and pressure, so as to cause the material of which fill layer 32 is formed to distribute substantially uniformly along the front surface 14 of first substrate 12 as well as along the carrier surface 24 of second substrate 22. The pressure and heat are adjusted based upon the chemical make-up of fill layer 32, and will be selected such that the distance "D" remains substantially the same after pressing the second substrate 22 to the first substrate 12 as before such pressing together. That is, the fill layer 32 will experience little to no flow into the void where the layer was removed, and the distance "D" after pressing together will be within about 10% of the distance "D" prior to pressing together. Typical temperatures during this step will range from about 150° C. to about 375° C., and preferably from about 160° C. to about 350° C., with typical pressures ranging from about 1,000 N to about 5,000 N, and preferably from about 2,000 N to about 4,000 N. If the outermost portion of the fill layer 32 is removed after bonding the substrates 12, 22 in face-to-face relationship, the stack 10 is formed by contacting the second substrate 22 with the fill layer 32, under heat and pressure as described above. The outermost portion of the fill layer 32 is then removed leaving a void between the peripheral region 18 of the first substrate 12 and the peripheral region 28 of the second substrate 22.

Alternatively, the fill layer 32 is provided as a laminate that is adhered to first substrate 12 under heat, pressure, and/or vacuum as necessary for the particular material to ensure there are no voids between the fill layer 32 and the front surface 14. The laminate is pre-cut to the appropriate shape (e.g., circular) or mechanically trimmed after application so that the appropriately sized distance "D" will be created, as discussed above.

Around the periphery of the outermost edge 33 of the fill layer 32 after the outermost portion of the fill layer 32 is removed, a bonding material forms an edge bond 34 between the first substrate 12 and second substrate 22, which will have a thickness corresponding to that described above with respect to fill layer 32. The edge bond 34 will be limited to the outer perimeter of the first substrate 12 and second substrate 22 (i.e., adjacent to the peripheral regions 18 and 28, of the device surface 14 and carrier surface 24, respectively). In instances where the substrate 12 is circular in shape, the edge bond 34 will be ring-shaped. Thus, in this embodiment, there is a non-uniform material distribution across the substrates 12, 22.

Again, like the removal of the outermost portion of the fill layer 32, the edge bond 34 can be applied either before or after the substrates 12, 22 are bonded in face-to-face relationship to one another. For example, where the fill layer 32 is comprised of low bonding strength material, such as TEFLON® AF, it is advantageous to apply the edge bond after application and partial removal of the fill layer 32, but before contacting of second substrate 22 with the fill layer 32 to bond the substrates. This alternative arrangement is particularly advantageous because the coated substrate 12 could be fabricated with first substrate 12 being provided as a carrier wafer. This substrate 12 could then be provided to an end user who would bond a device wafer to the coated substrate 12 and subject the resulting stack 10 to further processing. Thus, an adhesive-ready carrier would be available to the end user for added convenience, eliminating processing steps for the end user. Where the fill layer 32 and edge bond 34 are both applied before bonding the substrates 12, 22, the fill layer 32 and edge bond 34 can be applied to the same substrate, as described above. Alternatively, the fill layer 32 can be applied, and then the outermost portion removed from one substrate (e.g., the first substrate 12), while the edge bond 34 can be applied to the peripheral region 28 of another substrate (e.g., the second substrate 22), such as by spin coating. The substrates 12, 22 can then be bonded in face-to-face relationship. The edge bonding material can be introduced by any number of means. For example, when applied after the substrates are bonded in face-to-face relation ship, one suitable mechanism is the use of a needle, syringe, or tip dispense instrument to dispense the material into the void between the peripheral region 18 of the first substrate 12 and the peripheral region 28 of the second substrate 22, while the structure 10 is slowly rotated until peripheral regions are filled with the bonding material, thus forming the edge bond 34. The edge bond 34 may also be applied via capillary filling of void 44 or via chemical vapor deposition. In a further application process, a liquid (100% solids or solution), edge bonding material can be spin-applied onto the edge of the carrier or device wafer using an edge-wrapping baffle system before contacting the substrates 12 and 22. One such system is disclosed by Dalvi-Malhotra et al., "Use of silane-based primer on silicon wafers to enhance adhesion of edge-protective coatings during wet etching: Application of the TALON Wrap™ process," Proceedings of SPIE, vol. 6462, 2007, pp. 64620B-1-64620B-7, incorporated by reference herein. The edge bond 34 is then subjected to the appropriate curing or hardening process (e.g., UV curing).

The materials from which edge bond 34 is formed should be capable of forming a strong adhesive bond with the substrates 12 and 22. Anything with an adhesion strength of greater than about 50 psig, preferably from about 80 psig to about 250 psig, and more preferably from about 100 psig to about 150 psig, would be desirable for use as edge bond 34. In addition, the adhesion strength of the edge bond 34 is at least about 0.5 psig, preferably at least about 20 psig, and more preferably from about 50 psig to about 250 psig greater than the adhesion strength of the fill layer 32. Furthermore, the material of which edge bond 34 is formed must meet the thermal and chemical stability requirements of backside processing. The edge bond 34 should remain stable at temperatures of from about 150° C. to about 350° C., and preferably from about 200° C. to about 300° C. Furthermore, this material should be stable under the chemical exposure conditions encountered in the backside processes to which the bonded stack will be subjected. Edge bond 34 should not decompose (i.e., less than about 1% weight loss) or otherwise lose its mechanical integrity at the above described backside processing temperatures. These materials also should not release volatile compounds that might cause blistering of thin device wafers, especially when subjected to high vacuum processes such as CVD dielectric deposition.

Preferred edge-sealing or edge-bonding materials include commercial temporary wafer bonding compositions such as the WaferBOND® materials (available from Brewer Science Inc., Rolla, Mo.), some commercial photoresist compositions, along with other resins and polymers that exhibit high adhesion strength to semiconductor materials, glass, and metals. Especially preferred are: (1) high solids, UV-curable resin systems such as reactive epoxies and acrylics; (2) related thermosetting resin systems such as two-part epoxy and silicone adhesives; (3) thermoplastic acrylic, styrenic, vinyl halide (non-fluoro-containing), and vinyl ester polymers and copolymers along with polyamides, polyimides, polysulfones, polyethersulfones, and polyurethanes applied from the melt or as solution coatings that are baked after application to dry and render the peripheral regions 18 and 28 more dense; and (4) cyclic olefins, polyolefin rubbers (e.g., polyisobutylene), and hydrocarbon-based tackifier resins. As was the case with the materials used to form fill layer 32, it will be appreciated that the bonding strength of edge bond materials will also depend upon their specific chemical structures and the coating and baking conditions used to apply them.

In an alternative embodiment, only the edge bond 34 could be used between the first substrate 12 and second substrate 22. That is, in lieu of the fill materials described above, the layer represented by the fill layer 32 in FIG. 1 could be empty (i.e., air). Thus, there would be nothing but air adjacent the central region 20 of the first substrate 12 and the central region 30 of the second substrate 22.

Figure 2:
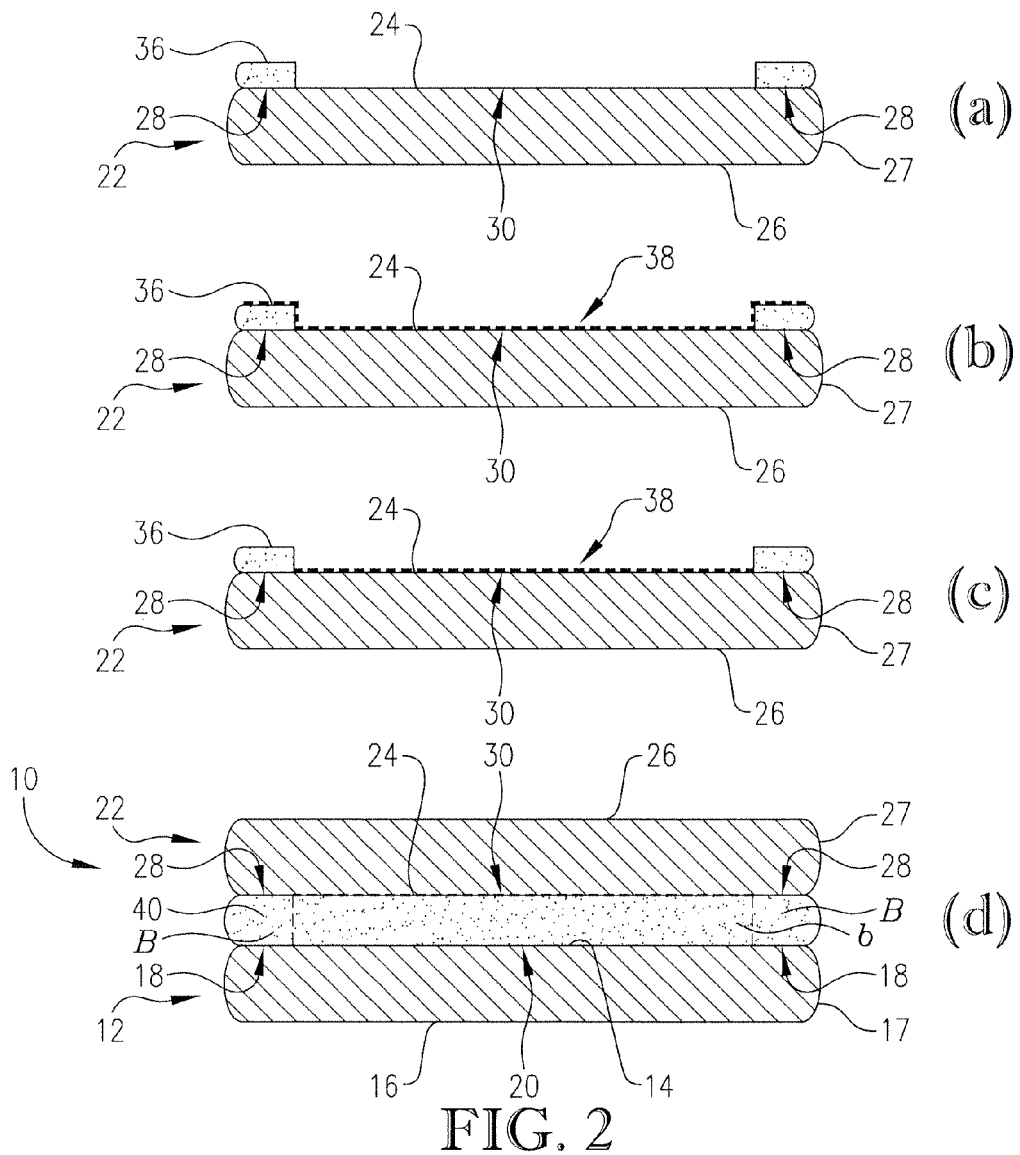
FIG. 2 is a schematic drawing showing an alternative embodiment for bonding substrates according to the invention.

Referring to FIG. 2, in another method of forming the stack 10, surface modification can be used to alter the bonding strength interface between the bonding material(s) and the first substrate 12 or second substrate 22, in lieu of a low bonding strength fill material in the intermediate layer. With reference to FIGS. 2(a)-(d), with like parts being numbered as in FIG. 1, a protective composition is applied to the peripheral region 28 of the carrier surface 24 of the second substrate 22 to form a layer of a mask 36 adjacent the peripheral region 28. Thus, if the second substrate 22 is circular in shape, the mask 36 is in the shape of a ring. A variety of suitable compositions can be used to form the mask 36. The mask 36 should be resistant to the solvent utilized during surface modification and other subsequent processing, but is also preferably formed from a composition that can be easily removed or dissolved from the carrier surface 24 without degrading the surface treatment or otherwise affecting the second substrate 22. The mask 36 is typically formed of a material comprising monomers, oligomers, and/or polymers dispersed or dissolved in a solvent system. Examples of suitable monomers, oligomers, and/or polymers include those selected from the group consisting of epoxies, polyamides, ethers, esters, cyclic olefin polymers and copolymer, amorphous fluoropolymers, and combinations thereof. Preferred compositions are selected from the group consisting of edge bonding materials, as described above (e.g., commercial temporary wafer bonding compositions, such as WaferBOND®), fill materials, as described above, and photoresist compositions (e.g., SU-8 2002, Microchem, Newton, Mass.). The mask 36 preferably has a width of from about 0.05 mm to about 10 mm, more preferably from about 0.5 mm to about 5 mm, and even more preferably from about 1 mm to about 2.5 mm. The mask preferably has a thickness of from about 0.05 μm to about 5 μm, more preferably from about 0.5 μm to about 2.5 μm, and even more preferably from about 0.5 μm to about 1 μm.

As shown in FIG. 2(b), the area on the carrier surface 24 of the second substrate 22 which is not coated with the mask 36 is then chemically modified to obtain a low bonding surface (i.e., a non-stick surface or a surface to which a fill or bonding material cannot strongly adhere). Preferably, the central region 30 of the carrier surface 24 is the area subjected to surface modification to provide a low adhesive strength interface when placed in contact with the bonding material. Suitable surface modification may include, for example, chemical treatment of the substrate surface 24 with a hydrophobic solution capable of reacting with the substrate surface 24 to reduce its surface free energy, as described above. More preferably, hydrophobic organosilane solutions are used. Particularly preferred surface modifying compositions 38 are selected from the group consisting of (fluoro)alkyl silane (e.g., perfluoroalkyltrichlorosilane), (fluoro)alkyl phosphonate, isocyanate silane, acrylate silane, and combinations thereof. The surface modifying composition 38 can be applied by any suitable method, such as by spin coating at a speed of at least about 1,000 rpm for about 100 seconds (and preferably about 2,000 rpm for about 60 seconds). Thus, the surface modifying composition 38 can be diluted with a solvent, such as FLUORINERT® (3M Corp.), prior to applying to the substrate surface 24. The second substrate 22 can then be baked to evaporate the solvent at about 50° C. to about 150° C. for about 30 second to about 5 minutes (and preferably at about 100° C. for about 1 minute). The substrate 22 can then be rinsed with additional solvent and baked again to evaporate the solvent, as described above, to remove unreacted surface modification solution 38 and rinse the surface modification solution 38 off of the mask 36, as shown in FIG. 2(c). It is preferable that the mask 36 does not react with the surface modification composition in this embodiment, so that the mask 36 is not also rendered "non-stick" by the surface modification. The advantage of the surface modification approach is that the intermediate layer can be selected for any combination of properties (e.g., thickness, solubility, thermal stability) other than providing a non-stick or low adhesive strength interface with the substrate, as described above with regard to FIG. 1. Another advantage is that a uniform bonding composition can be used for the entire intermediate layer in lieu of a separate fill material 32 and edge bond 34.

The surface 14 of the first substrate 12 (the device wafer) is then coated with a bonding composition to create a bonding layer 40 on and across the surface 14, and the first substrate 12 and treated second substrate 22 are then bonded in a face-to-face relationship, as shown in FIG. 2(d), with the second substrate 22 now being on top of the stack 10. This contact is preferably carried out under heat and pressure, so as to cause the material of which bonding layer 40 is formed to distribute substantially uniformly along the front surface 14 of first substrate 12 as well as along the carrier surface 24 of second substrate 22. More preferably, the substrates 12, 22 are bonded under vacuum and in a heated, pressurized chamber (preferably at from about 100 to about 300° C., for about 1 to about 10 minutes, and more preferably from about 100 to about 200° C., for about 2 to about 5 minutes). In this embodiment, the mask 36 is not removed prior to bonding the two substrates 12, 22 in face-to-face relationship. Thus, it is preferable that the protective material used to form the mask 36 is of the same material, or of a similar or compatible material, as the materials from which the bonding layer 40 are formed, so that upon bonding the substrates 12, 22 as described above, the mask 36 and bonding materials reflow together to form a uniform bonding layer 40, as shown in FIG. 2(d). The thickness of the bonding layer 40 will depend upon the height of the topography on the device wafer 12, and can range between about 5 μm to about 150 μm. In some embodiments, the preferred thickness ranges from about 5 μm to about 100 μm, more preferably from about 5 μm to about 50 μm, and even more preferably from about 10 μm to about 30 μm.

The materials from which bonding layer 40 are formed should be capable of forming a strong adhesive bond with the substrates 12 and 22, except where treated with the surface modifying composition 38. Suitable bonding materials include anything with an adhesion strength of greater than about 50 psig, preferably from about 80 psig to about 250 psig, and more preferably from about 100 psig to about 150 psig. Furthermore, the material of which bonding layer 40 is formed must meet the thermal and chemical stability requirements of backside processing. The bonding layer 40 should remain stable at temperatures of from about 150° C. to about 350° C., and preferably from about 200° C. to about 300° C. Furthermore, this material should be stable under the chemical exposure conditions encountered in the backside processes to which the bonded stack will be subjected. The bonding layer 40 should not decompose (i.e., less than about 1% weight loss) or otherwise lose its mechanical integrity at the above described backside processing temperatures. These materials also should not release volatile compounds that might cause blistering of thin device wafers, especially when subjected to high vacuum processes such as CVD dielectric deposition.

Preferred bonding materials include commercial temporary wafer bonding compositions such as the WaferBOND® materials (available from Brewer Science Inc., Rolla, Mo.), some commercial photoresist compositions, along with other resins and polymers that exhibit high adhesion strength to semiconductor materials, glass, and metals. Especially preferred are: (1) high solids, UV-curable resin systems such as reactive epoxies and acrylics; (2) related thermosetting resin systems that cure or crosslink upon heating, such as two-part epoxy and silicone adhesives, cyclic olefin polymers and copolymers with thermal catalyst initiators, and CYCLOTENE® (Dow Chemical); (3) thermoplastic acrylic, styrenic, vinyl halide (non-fluoro-containing), and vinyl ester polymers and copolymers along with polyamides, polyimides, polysulfones, polyethersulfones, and polyurethanes applied from the melt or as solution coatings that are baked after application to dry; and (4) cyclic olefins, polyolefin rubbers (e.g., polyisobutylene), and hydrocarbon-based tackifier resins. Thermosetting materials also require the use of a crosslinking agent and potentially a catalyst in the system as well as a step to induce crosslinking, as described in more detail herein. The foregoing materials are also useful for forming the mask 36 in this embodiment.

In the resulting stack 10, the bonding layer 40 contacts the modified central region 30 and the non-modified peripheral region 28 on the carrier surface 24. Advantageously, the bonding interface between the bonding layer 40 and the central region 30 of the carrier surface 24 is weaker than the bonding interface between the bonding layer 40 and the peripheral region 28 of the carrier surface 24. Thus, in the bonding layer 40, high adhesive strength regions "B" and low adhesive strength regions "b" are formed. The transition between the high adhesive strength regions "B" and the low adhesive strength regions "b" along the interface between the bonding layer 40 and the carrier surface 24 indicates the initial location of where the two substrates 12, 22 will begin to peel apart during separation. It will be appreciated that during processing, the width of the mask 36 can be varied depending upon the desired size and location of the high adhesive strength regions "B". Likewise, particularly when the mask 36 is formed from photoresist compositions or other patternable layers, the mask 36 could also be applied as a uniform layer over the carrier surface 24, and then patterned and developed in any number of ways (such as to form a grid, lines, shapes, etc.). Subsequent surface modification would result in a patterned nonstick surface treatment. Accordingly, the location and manner of separation of the substrates 12 and 22 can be customized to the user's desired specifications.

Figure 3:
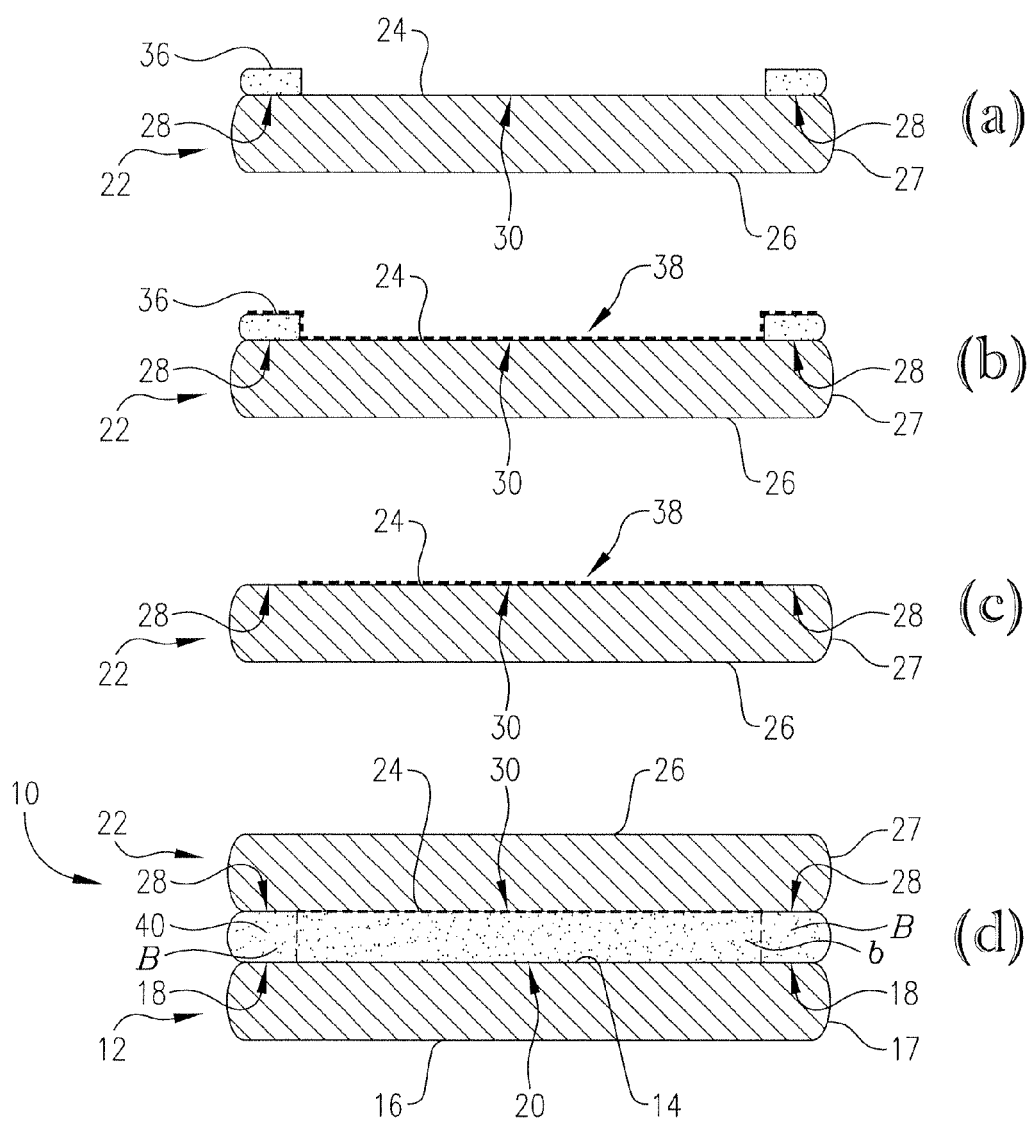
FIG. 3 is a schematic drawing showing another alternative embodiment for bonding substrates according to the invention.

Referring to FIG. 3, another alternative embodiment of the present invention is depicted, with like parts being numbered as in FIG. 2. As illustrated in this figure, the substrates 12, 22, mask 36, and bonding layer 40, are formed of the same materials as described above with respect to FIG. 2, except that in step (c) of FIG. 3, the mask 36 is removed from the carrier surface 24 thereby exposing the peripheral region 28 of the carrier surface 24, which remains untreated with the surface modifying composition 38. The mask 36 can be removed by solvent dissolution, acid or base wet development processes, or plasma etching. The first substrate 12 and treated second substrate 22 are then bonded in a face-to-face relationship with the second substrate 22 now being on top in FIG. 3(d). This contact is preferably carried out under heat and pressure, so as to cause the material of which bonding layer 40 is formed to distribute substantially uniformly along the front surface 14 of first substrate 12 as well as along the carrier surface 24 of second substrate 22, so that the bonding layer 40 contacts the modified central region 30 and the non-modified peripheral region 28 on the carrier surface 24, as previously described. The mask 36 in this embodiment can also be patterned as described above, followed by surface modification and removal of the mask 36, resulting in a patterned nonstick surface treatment once the mask 36 is removed. Because this mask 36 is removed, the mask 36 can be made of any material suitable for masking and does not have to be compatible with the materials used to form the bonding layer 40. Likewise, the mask 36 can be reactive with the surface modification composition 38, as long as it can still be removed from the carrier surface 24 to reveal the untreated peripheral region 28 of the second substrate 22.

Figure 4:
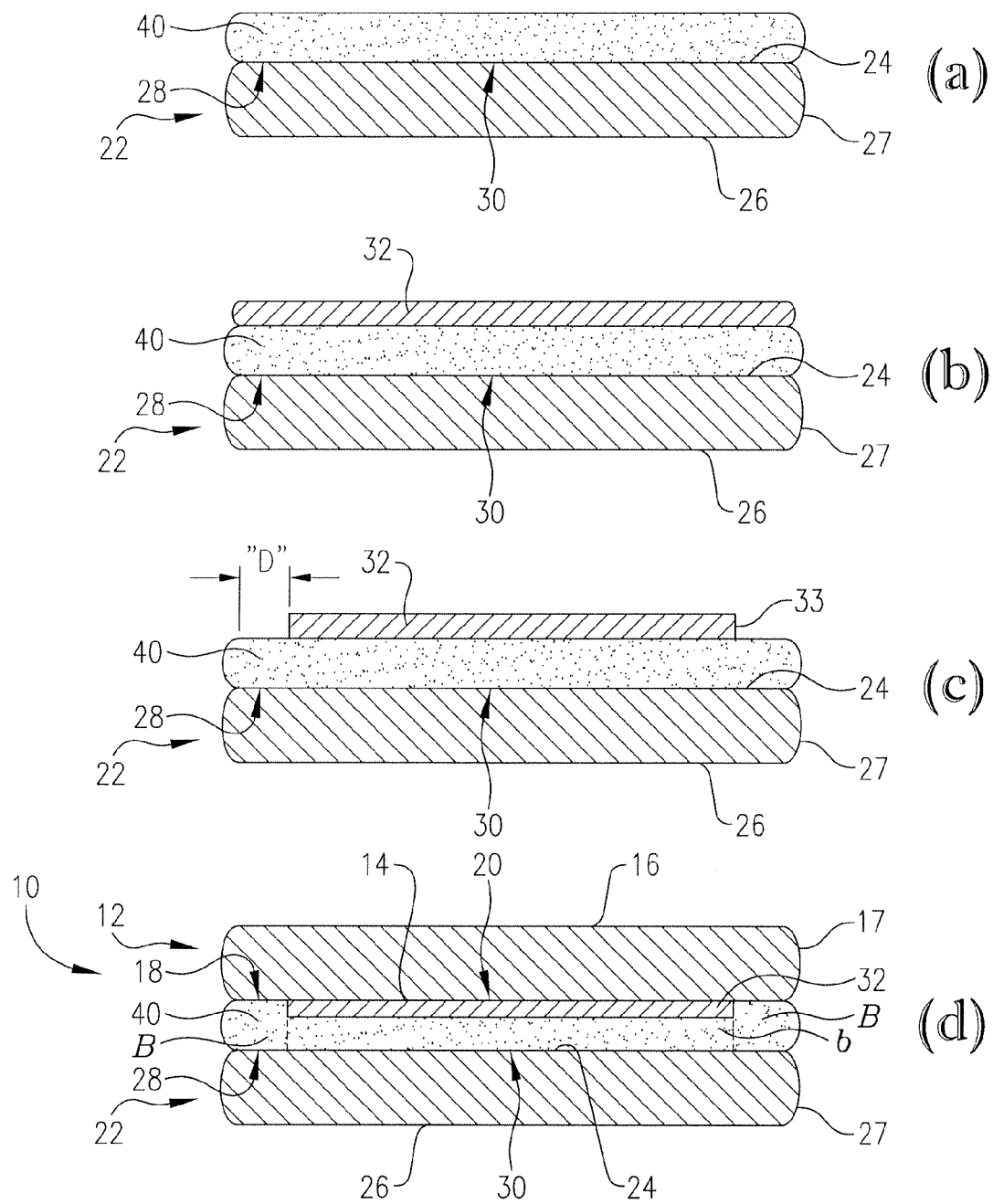
FIG. 4 is a schematic drawing showing yet another alternative embodiment for bonding substrates according to the invention.

FIG. 4 depicts another embodiment of forming a stack 10 in accordance with the invention. A bonding composition is applied to the surface 24 of the second substrate 22 to form a bonding layer 40. The bonding layer 40 can be formed of any suitable materials, as previously described with regard to FIG. 2, although thermosetting materials are particularly preferred. The thickness of the bonding layer 40 will depend upon the height of the topography on the first substrate 12, and can range between about 5 μm to about 150 μm. In some embodiments, the preferred thickness ranges from about 5 μm to about 100 μm, more preferably from about 5 μm to about 50 μm, and even more preferably from about 10 μm to about 30 μm. A layer of fill material is applied to the bonding layer 40 to form a fill layer 32 as shown in FIG. 2(b). The fill layer 32 has a thickness of from about 0.05 μm to about 5 μm, preferably from about 0.5 μm to about 2.5 μm, and more preferably from about 0.5 μm to about 1 μm. In this embodiment, the fill layer 32 does not form strong adhesive bonds, and is preferably formed of a low bonding strength material, as described above with regard to FIG. 1. Thus, suitable materials for forming the fill layer 32 in this embodiment include compositions having the properties described above, including cyclic olefin polymers and copolymers sold under the APEL® by Mitsui, TOPAS® by Ticona, and ZEONOR® by Zeon brands, and solvent-soluble fluoropolymers such as CYTOP® polymers sold by Asahi Glass and TEFLON® AF polymers sold by DuPont. Although it will be appreciated that the bonding strength of these materials will depend upon the coating and baking conditions used to apply them.

Next, as shown in FIG. 4(c), the outermost portion fill layer 32 is removed. This can be accomplished by any means that will allow for removal of the desired quantity without damaging the integrity of the bonding layer 40, including dissolving the outermost portion with a solvent that is known to be a good solvent for the material of which fill layer 32 is formed. Examples of such solvents include those selected from the group consisting of aliphatic solvents (e.g., hexane, decane, dodecane, and dodecene), fluorocarbon solvents, and mixtures thereof. After edge removal, fill layer 32 has an outermost edge 33, which is spaced a distance "D" from the plane defined by the outermost edge 27 of the second substrate 22. "D" is typically from about 0.05 mm to about 10 mm, preferably from about 0.5 mm to about 5 mm, and more preferably from about 1 mm to about 2.5 mm. Contact with the edge removal solvent can be maintained for a sufficient time to dissolve the desired amount of fill layer 32 to achieve the desired distance "D," but typical contact times would be from about 5 seconds to about 120 seconds.

Referring to FIG. 4(*d*), the second substrate 22 is bonded in face-to-face relationship with the first substrate 12. This contact is preferably carried out under heat and pressure, so as to cause the material of which bonding layer 40 is formed to reflow around the fill layer 32 and into the space left by the edge removal process so as to contact uniformly the peripheral region 18 of the front surface 14 of the first substrate 12. More preferably, the substrates 12, 22 are bonded under vacuum and in a heated, pressurized chamber (preferably at from about 100 to about 300° C., for about 1 to about 10 minutes, and more preferably from about 100 to about 200° C., for about 2 to about 5 minutes). In this embodiment, the bonding layer 40 can be formed from a composition that cures or crosslinks upon heating, such as an epoxy-based photoresist composition. Thus, in one aspect, after contacting the first substrate 12 and second substrate 22 under heat and pressure, the stack 10 is then exposed to radiation (i.e., light) to initiate crosslinking (curing) of the layer 40, followed by a post-exposure bake (PEB) at a temperature of from about 75° C. to about 300° C., more preferably from about 100° C. to about 250° C., and more preferably from about 100° C. to about 175° C., for a time period of from about 15 seconds to about 120 seconds. Thus, the materials used to form the bonding layer 40 in this embodiment, will comprise a crosslinking agent, and optionally a catalyst in the system.

Advantageously, the bonding interface between the central region 20 of the device surface 14 and the fill layer 32 is weaker than the bonding interface between the bonding layer 40 and the peripheral region 18 of the device surface 14. Thus, high adhesive strength regions "B" and low adhesive strength regions "b" are formed. The transition between the high adhesive strength regions B and the low adhesive strength regions b along the interface between the front surface 14 of the first substrate 12, and the bonding layer 40 and fill layer 32 indicates the initial location where the two substrates 12, 22 will begin to peel apart during separation.

Referring to the stacks formed in FIGS. 1, 2(*d*), 3(*d*), and 4(*d*), at this stage, the first substrate 12 in the stack 10 can be safely handled and subjected to further processes that might otherwise have damaged the first substrate 12 without being bonded to the second substrate 22. Thus, the first substrate 12 of the structure 10 can safely be subjected to backside processing such as back-grinding, CMP, etching, metal and dielectric deposition, patterning (e.g., photolithography, via etching), passivation, annealing, and combinations thereof, without separation of substrates 12 and 22 occurring, and without infiltration of any chemistries encountered during these subsequent processing steps into central regions 20 and 30 between substrates 12 and 22.

Advantageously, the dried or cured layers of the stacked structure 10 in this and all embodiments will possess a number of highly desirable properties. For example, the layers will exhibit low outgassing during heating and/or vacuum deposition processes. That is, baking at about 150-300° C. for up to about 60 minutes results in a film thickness change of fill layer 32 and edge bond 34 of less than about 5%, preferably less than about 2%, and even more preferably less than about 1.0%. The dried layers can also be heated to temperatures of up to about 350° C., preferably up to about 320° C., and more preferably up to about 300° C., without chemical reactions occurring in the layer. In some embodiments, the layers in the bonded stack can also be exposed to polar solvents (e.g., N-methyl-2-pyrrolidone) at a temperature of about 80° C. for about 15 minutes without reacting or dissolving.

The bond integrity of edge bond 34 or the bonding layer 40 can be maintained even upon exposure to an acid or base. That is, a dried edge bond 34 having a thickness of about 15 μm can be submerged in an acidic media (e.g., concentrated sulfuric acid) at room temperature for about 10 minutes or in a basic media (e.g., 30 wt. % KOH) at about 85° C. for about 45 minutes while maintaining bond integrity. Bond integrity can be evaluated by using a glass carrier substrate and visually observing the edge bond 34 through the glass carrier substrate to check for bubbles, voids, etc.

Once the desired processing is completed, first substrate 12 and second substrate 22 can be readily separated. Although the edge bond 34 or the peripheral region (corresponding to "B") of bonding layer 40 can be maintained intact prior to separation of the substrates 12, 22, in a preferred method, the edge bond 34 or the peripheral region "B" of bonding layer 40 is first chemically, mechanically, acoustically, or thermally softened, dissolved, or disrupted to allow the wafers to be easily separated with very low forces at about room temperature (~23° C.). For example, the edge bond 34 or peripheral region of bonding layer 40 is first dissolved with the aid of a solvent or other chemical agent. This can be accomplished by immersion in the solvent, or by spraying a jet of the solvent onto edge bond 34 or peripheral region of bonding layer 40 in order to dissolve it. The use of thermoplastic materials is especially desirable if solvent dissolution is to be used to disrupt the edge bond 34 or bonding layer 40. Solvents that could typically be used during this removal process include those selected from the group consisting of ethyl lactate, cyclohexanone, N-methyl pyrrolidone, aliphatic solvents (e.g., hexane, decane, dodecane, and dodecene), and mixtures thereof. The edge bond 34 or peripheral region of bonding layer 40 is preferably at least partially (about 50%) removed, and more preferably substantially (about 85%) removed with the solvent.

The substrates 12 and 22 can also be separated by first mechanically disrupting or destroying the continuity of the edge bond 34 or peripheral region of the bonding layer 40 using laser ablation, plasma etching, water jetting, or other high energy techniques that effectively etch or decompose the edge bond 34 or peripheral region of the bonding layer 40. It is also suitable to first sever the edge bond 34 or peripheral region of the bonding layer 40 with a fracture or break, or to saw or cut through or cleave the edge bond 34 or peripheral region of the bonding layer 40 by some equivalent means.

Regardless of which of the above means is utilized, a low mechanical force (e.g., finger pressure, gentle wedging) can then be applied to completely separate the substrates 12 and 22. Advantageously, the first substrate 12 and second substrate 22 can be separated using a peeling motion, so that one of the substrates 12 or 22 is peeled away from the stack. To initiate peeling a force is applied to a portion (e.g., less than ½, preferably less than ⅓, more preferably less than ¼, and even more preferably less than ⅒) of the periphery of the substrate to be separated. As discussed above, the location of initial separation will depend upon the location of the transition of the between the high adhesive strength regions "B" and the low adhesive strength regions "b" along the interface between the bonding and/or fill layers and the substrate surface. As the initial portion of the periphery of the substrate is lifted or pushed further upwards, the location of the bend of the substrate moves gradually along the interface between the substrate surface and the bonding and/or fill layers from the initial portion of the periphery where the force is applied until eventually the entire surface of the substrate has been separated from the stack. To facilitate separation, the stack can be simultaneously moved away (i.e., lowered downwardly) while the force is being applied to the substrate to be separated, preferably in an upwards direction. The amount of force applied to the periphery of the substrate will vary, but preferably range between about 0.25 Newtons to about 100 Newtons, more preferably from about 2 Newtons to about 75 Newtons, and even more preferably to about 5 Newtons to about 50 Newtons, as measured at the portion of the periphery of the substrate where force is applied.

Figure 5A:
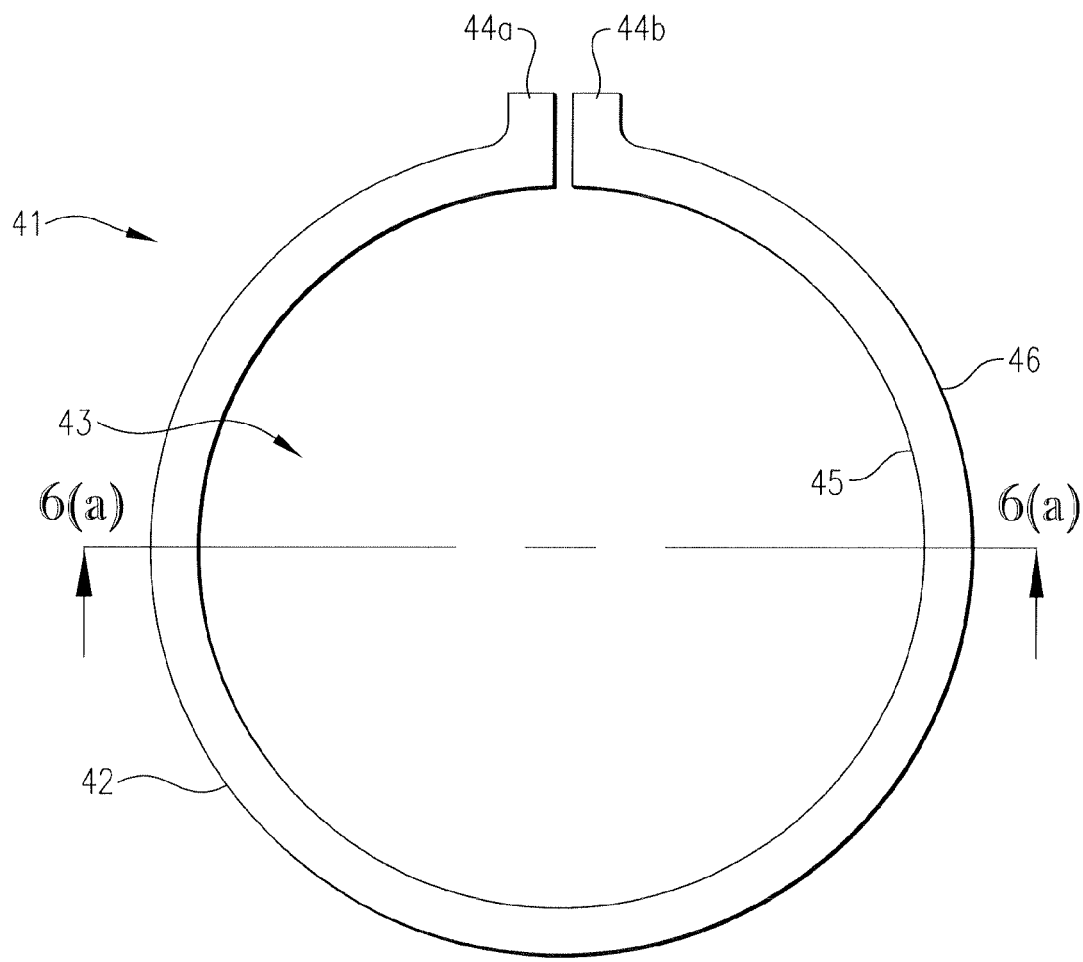
FIG. 5(a) is a top elevation view of a ring clamp for separating bonded substrates in accordance with an embodiment of the invention.

In a preferred method, an annular clamp 41 is provided in the form of a split ring clamp for separating the substrates 12, 22. Referring to FIG. 5(a), the ring clamp 41 has a planar body 42 with a substantially circular shape defining the periphery and a central opening 43. Preferably, the ring clamp body 42 is unitarily-formed, with a split at one location to form two free ends 44a, 44b, preferably in the form of shoulders. The term "unitarily formed" as used herein is interchangeable with the term "integrally formed" and means that such unitarily formed parts are "integral" and are not attached to each other in a separate step or detachable from each other, but are formed from a single piece of material. Suitable materials for the ring body 42 are selected from the group consisting of metals, ceramics, polymers, composites, and combinations thereof. The ends 44a, 44b are either moved away from one another (i.e., spread apart) in the open configuration or drawn toward one another in the closed configuration to compressively engage the wafer to be separated from the stack 10. That is, the free ends 44a, 44b are adapted to be clamped in proximal relationship so that the ring fits around the circumference (periphery) of the wafer. Preferably, in the closed configuration, the ends 44a, 44b are urged toward one another, but remain unjoined (i.e., a gap between the ends remains and the ring forms a discontinuous circular body), although the ends 44a, 44b can be joined to form a gap-free continuous shape. In use, the drawing together or spreading apart of the ends 44a, 44b causes the central opening 43 to be reduced or enlarged to effect the clamping action of the body 42 around the wafer to be separated from the stack 10, and permits for accommodation of various-sized wafers, while maintaining even pressure throughout the circumference (periphery) of the wafer where engaged by the ring. In another embodiment, the ring clamp 41 could be a multi-piece system, with each piece being unitarily formed. The pieces are brought together to form the ring around the circumference of the wafer engaging it as described above. The multi-piece system can comprise from about 2 to about 25 pieces, more preferably from about 2 to about 10 pieces, even more preferably from about 2 to about 4 pieces, and most preferably about 2 pieces. Advantageously, regardless of the embodiment, the ring clamp 41 does not need to engage all 360° of the periphery of the substrate to effectively separate the stack. Rather, the ring clamp body 42 is suitable for use with wafer flats having one or more flat edges, as explained in more detail below.

Figure 6C:
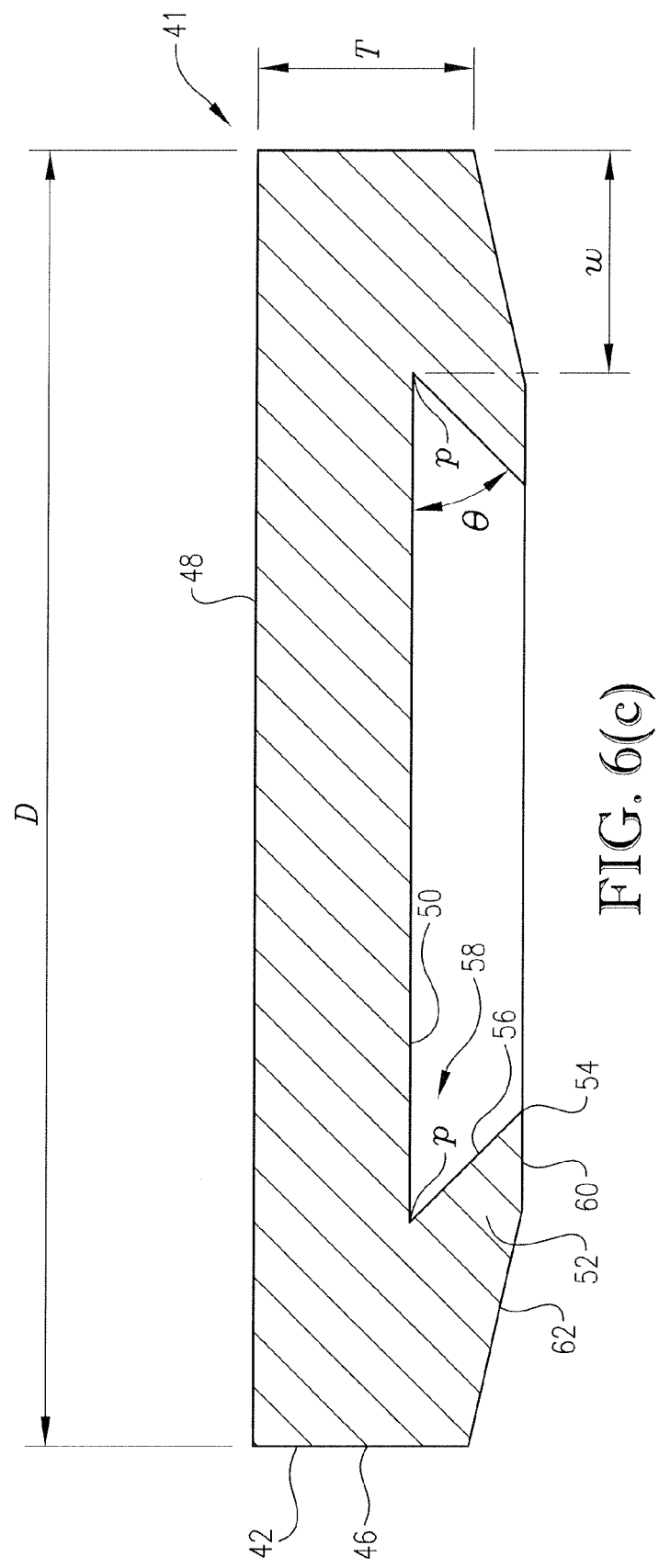
FIG. 6(c) is a fragmentary cross-sectional view of a disc-shaped clamp apparatus taken along section line 6(c) in FIG. 5(b) for separating bonded substrates in accordance with another embodiment of the invention.

Referring to FIG. 6(a), the ring clamp body 42 has an annular interior sidewall 45 defining the inner diameter "d" of the ring body 42, and an annular exterior sidewall 46 defining the outer diameter "D" of the ring body 42. The inner diameter "d" ranges from about 10 mm to about 400 mm, preferably from about 75 mm to about 350 mm, and more preferably from about 100 mm about to about 275 mm. The outer diameter "D" ranges from about 25 mm to about 550 mm, preferably from about 100 mm to about 400 mm, and more preferably from about 250 mm to about 350 mm. However, it will be appreciated that the ring body 42 can be of virtually any size depending upon the size of the wafer to be separated. The interior sidewall 45 and exterior sidewall 46 are substantially parallel to one another. The ring body 42 has a width "W," as measured from the interior sidewall 45 to the exterior sidewall 46, of from about 0.1 to about 50 mm, preferably from about 0.5 to about 25 mm, and more preferably from about 1 to about 12 mm. The interior sidewall 45 also has a thickness "t," which ranges from about 0.1 to about 15 mm, more preferably from about 0.5 to about 10 mm, and even more preferably from about 1 to about 5 mm. The exterior sidewall 46 has a thickness "T," which preferably ranges from about 0.15 to about 16 mm, more preferably from about 0.55 to about 11 mm, and even more preferably from about 1.5 to about 6 mm. The ratio of t:T will preferably be from about 1:20 to about 1:1, more preferably from about 1:10 to about 1:5, and even more preferably about 2:3.

The ring body 42 also has a top surface 48 extending between the interior sidewall 45 and exterior sidewall 46, and a wafer-engaging surface 50 extending from the interior sidewall 45 outwardly in substantially parallel alignment with the top surface 48. The wafer-engaging surface 50 does not extend all of the way to the exterior sidewall 46, but terminates at a point "p" that is spaced from the exterior sidewall 46 at a width "w," as measured from that point "p" to the external sidewall 46. The width w ranges from about 0.01 to about 45 mm, preferably from about 0.1 to about 20 mm, and more preferably from about 0.5 to about 10 mm. The ring body 42 has an inwardly extending annular ridge 52, which slopes inward and downward from point "p" of the wafer-engaging surface 50, and away from the plane defined by the top surface 48 and wafer-engaging surface 50, terminating in a free edge 54. The ridge 52 has a sloped shoulder surface 56 extending between the free edge 54 and the point "p" where the wafer-engaging surface 50 terminates in the ring body 42. Thus, the outwardly extending wafer-engaging surface 50 and inwardly and downwardly extending annular ridge 52 cooperatively form an annular wafer-receiving groove 58 at an acute angle (O). Preferably, the groove angle (O), as measured from the wafer-engaging surface to the shoulder surface, is from about 10° to about 90°, preferably from about 20° to about 75°, and more preferably from about 30° to about 60°. The annular ridge 52 also has an underside surface 60, which preferably extends parallel to the planes defined by the wafer-engaging surface 50 and the top surface 48. The ring body 42 also has a bottom surface 62, which slopes downward and away from the plane defined by the top surface 48, extending between the exterior sidewall 46 and the underside surface 60 of the annular ridge 52.

The free edge 54 of the annular ridge 52 preferably does not extend inward past the plane "P" defined by the interior sidewall 45. Thus, the annular ridge 52 and groove 58 are outwardly offset from the interior sidewall 45, so that when a wafer is received in the groove 58, the backside surface 26 of the wafer is engaged by the wafer-engaging surface 50 of the ring body 42, and the outer edge 27 and peripheral region 28 of the wafer are engaged by the shoulder 56 and free edge 54 of the ridge 52. This is shown in FIG. 6(b) using the second substrate 22 as an example. The ring clamp 42 is then moved into the close configuration, thereby retaining the wafer 22 in the groove 58. More specifically, at least a portion of the periphery of the wafer 22 is received in the groove 58. Where the wafer edge 27 is rounded or beveled, the shoulder 56 and free edge 54 engage the rounded corner of the wafer created by the wafer edge 27 and the peripheral region 28, designated by "x."

Figure 5B:
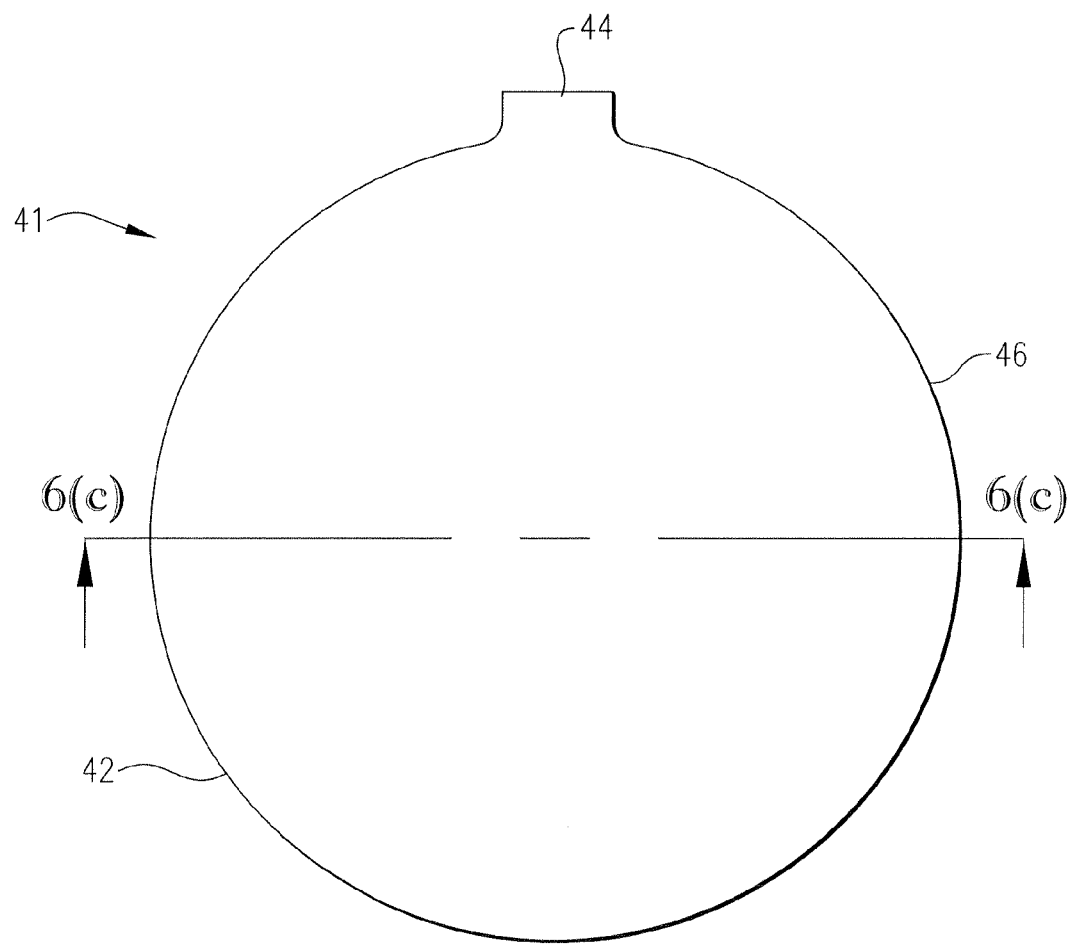
FIG. 5(b) is a top elevation view of a disc-shaped clamp for separating bonded substrates in accordance with another embodiment of the invention.

In an alternative embodiment of the invention, as shown in FIG. 5(b), the clamp body 42 does not have a central opening 43. Rather, the void corresponding to the central opening 43 depicted in the FIGS. 5(*a*) and 6(*a*) is solid and the clamp body 42 is disc-shaped. Accordingly, as shown in FIGS. 5(*b*) and 6(*c*), the top surface 48 extends the entire diameter "D" between the exterior sidewall 46, and the wafer-engaging surface 50 extends the entire distance between point "p."

In use, referring to FIG. 7, stack 10 is placed on a chuck 64 capable of providing adequate hold-down force to secure the first substrate 12 during subsequent steps. The chuck 64 could use vacuum force, electrostatic force, magnetic force, mechanical force, physical restraint, or any other suitable means that would provide proper hold-down force while providing support for the first substrate 10 without causing damage. The ring clamp body 42 is placed about the periphery of the second substrate 22, so that the substrate 22 is received in the wafer-receiving groove 58, as described above. The free ends 44*a*, 44*b* of the body 42 are drawn towards one another to compressively engage the periphery of the second substrate 22 (not shown). The ring clamp 41 preferably provides even pressure throughout the circumference of the second substrate 22, except in embodiments where the second substrate 22 is a wafer flat. In that case, one portion of the periphery (i.e., the flat side) of the wafer is not engaged by the clamp. As noted above, the ring clamp does not need to engage all 360° of the periphery (circumference) of the substrate to effectively separate the stack 10. Rather, it is suitable for the ring clamp to engage only about 1° of the periphery of the substrate 22 for effective separation. More specifically, the ring clamp preferably engages at least about 25° of the substrate periphery, more preferably from about 45° to about 90°, and even more preferably from about 90° to about 180° of the substrate periphery. When a wafer flat is used, the flat edge is faced away from the initial peel location, such that the flat edge is the last portion of the wafer to be detached during the debonding step.

Importantly, the ring clamp body 42, when clamped, engages only the second substrate 22, and makes no contact with the first substrate 12. Thus, when the first substrate 12 is a device wafer, the inventive method and apparatus permits effective separation of the stack 10 without inflicting any mechanical force or stress on the device wafer, minimizing the risk of breaking or damaging the device. As explained above, the edge bond 34 or peripheral region of the bonding layer 40 is preferably partially or substantially removed prior to separation of the substrates. However, the edge bond 34 or peripheral region of the bonding layer 40 does not have to be removed. Thus, where the edge bond 34 or peripheral region of the bonding layer 40 is present, the ring clamp body 42 may also make contact with edge bond 34 or peripheral region of the bonding layer 40.

In an alternative embodiment, shown in FIG. 8, a layer of an adhesive film or tape 66 is applied adjacent the chuck 64 to secure the first substrate 12 to the chuck 64. The stack 10 is then placed adjacent the adhesive film layer 66. Suitable materials for the adhesive film or tape layer 66 include those having relatively low adhesion, no adhesive transfer, and the ability to stretch without tearing. Preferably, the adhesive film layer 66 is formed using dicing tape, which is typically used in the art to temporarily support device substrates for handling purposes during low-temperature operations. Here, the adhesive film layer 66 provides additional support for the first substrate 12 after separation, particularly where the device substrate 12 has delicate features built on it or has been thinned. Preferred dicing tapes are selected from the group consisting of poly vinyl chloride, polyethylene, polyolefin, and combinations thereof. The adhesive film layer 66 preferably has a thickness of from about 0.01 to about 3 mm, more preferably from about 0.05 to about 1 mm, and even more preferably from about 0.07 to about 0.2 mm.

Referring to FIG. 9, regardless of the embodiment, a force (preferably upward) is applied to only a portion (e.g., less than ½, preferably less than ⅓, more preferably less than ¼, and even more preferably less than ⅒) of the periphery of the ring clamp body 42 during separation, thereby lifting the corresponding portion of the periphery of the second substrate 22, defined by edge 27, in a direction away from the device wafer 12 beginning at the peripheral region 28 of the substrate 22. The amount of force applied to the edge of the substrate will vary, but preferably range between about 0.25 Newtons to about 100 Newtons, more preferably from about 2 Newtons to about 75 Newtons, and even more preferably to about 5 Newtons to about 50 Newtons, as measured at the edge of the substrate. Thus, the second substrate 22 is separated from the stack 10 via a peeling motion, as previously described. It will be appreciated that the location of initial separation depicted in FIG. 9 is by way of example only, and that the actual location of separation will depend on the materials and surface treatments (if any) used to form the stack, as described above, including the location and/or pattern of the non-stick surface modification or low strength bonding layers included in the stack. As previously explained, the location of adhesive failure, which will determine the initial location of separation, can be modified as desired by the end user.

Furthermore, the ring body 42 is preferably flexible so that when the portion of the periphery of the ring clamp 41 is raised, the body 42 in that location flexes or bends, preferably upward, with the force. This deflection in the ring body 42 causes the corresponding portion of the periphery of the substrate 22 to likewise bend or deflect at an angle away from the stack 10. That is, as shown in FIG. 9, when one portion of the periphery of the ring body 42 is raised, the opposite portion of the ring body 42 preferably remains substantially stationary and does not press downward on the stack 10 in response to the other portion being raised. To further facilitate separation, the chuck 64 securing the first substrate 12 can be gradually moved away from the second substrate 22 during separation, and is preferably lowered downward. The lowering of the chuck 64 can be done simultaneously with the applying of force to the ring clamp 42. Alternatively, the force on the second substrate 22 and the resulting peeling motion is effected by the movement of the chuck 64 away from the second substrate 22, which is held substantially stationary as the stack 10 is pulled away.

Advantageously, and unlike prior art bonding methods, separation does not require overcoming strong adhesive bonds between the fill layer 32, edge bond 34, or bonding layer 40 and the entire surface of substrate 12 or substrate 22. Instead, it is only necessary to release the adhesive bonds at edge bond 34 or peripheral region of the bonding layer 40 in contact with the peripheral regions 18 and 28 for separation to occur. Once separated, the surface of the first substrate 12 can then be rinsed clean with appropriate solvents or any other wet or dry etch techniques as necessary to remove residual edge bond 34, fill layer 32 or bonding layer 40 materials, as applicable.

Figure 11:
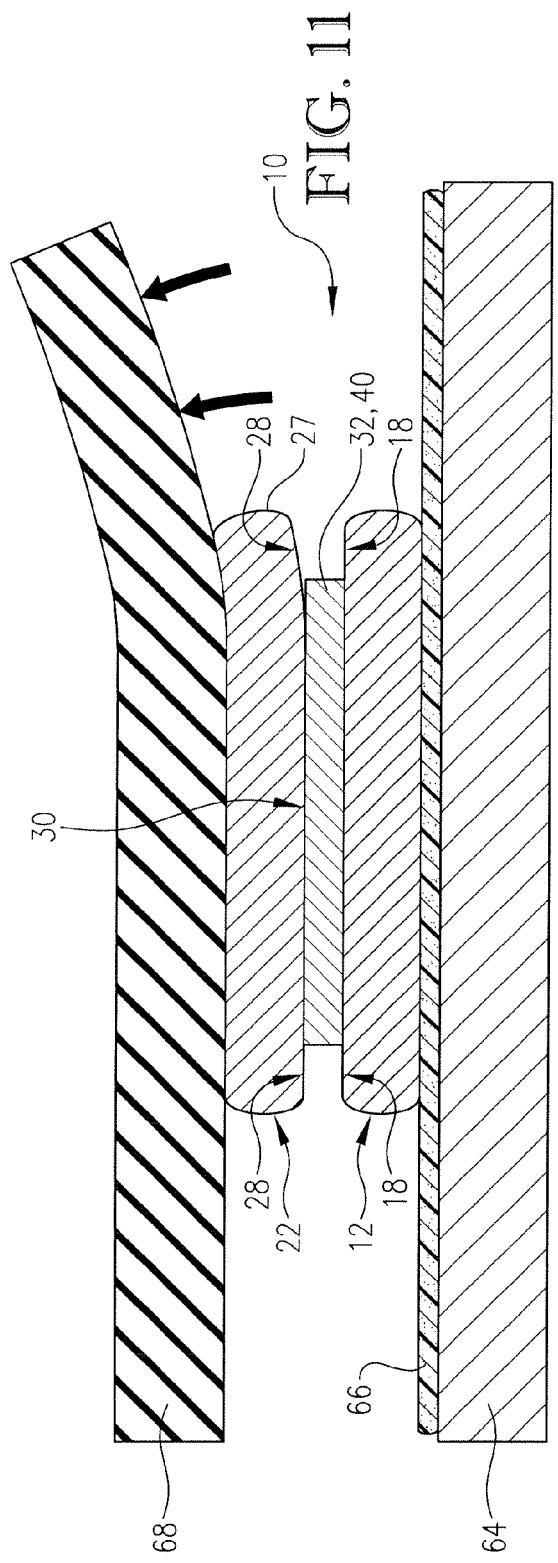
FIG. 11 is a schematic cross-section drawing of an embodiment of the invention utilizing a flexible chuck and an adhesive-covered chuck for separation of the bonded substrates.

In another embodiment, depicted in FIG. 10, with like numbering being used for like parts, the ring clamp 42 is replaced with a flexible chuck 68 having a periphery. The flexible chuck is capable of providing adequate pulling force to secure the second substrate 22 during subsequent steps. This flexible chuck 68 could use vacuum force, electrostatic force, or any other suitable means that would provide proper force while providing support for the second substrate 22 without causing damage while still allowing it to bend to create the peeling motion. Suitable materials for the flexible chuck 68 including those selected from the group consisting of silicones, polyimides, polyamides, olefins, fluoro polymers, nitriles, other rubbers, and any other flexible materials. As with the ring clamp embodiment, an adhesive film 66 could also be used to support the first substrate 12 in the stack, as shown in FIG. 11. In either embodiment, a force is then applied to a portion of the periphery of the flexible chuck 68, thereby lifting the corresponding portion of the periphery of the second substrate 22 and removing it from the stack 10 in a peeling motion, as described. Again, the actual location of initial separation between materials in the peripheral region 28 and central region 30 of the substrate 22 depends on the materials used and location of the surface treatment (if any), fill layer 32, edge bond 34, and/or bonding layer 40. The first substrate 12 can then be rinsed clean with appropriate solvents as necessary to remove residual edge bond 34, fill layer 32, or bonding layer 40 materials, as applicable. Advantageously, where the first substrate 12 is a device wafer, there is no mechanical force or stress applied to the device wafer in the inventive separation method, minimizing the risk of breaking or damaging the wafer during separation.

Figure 12:
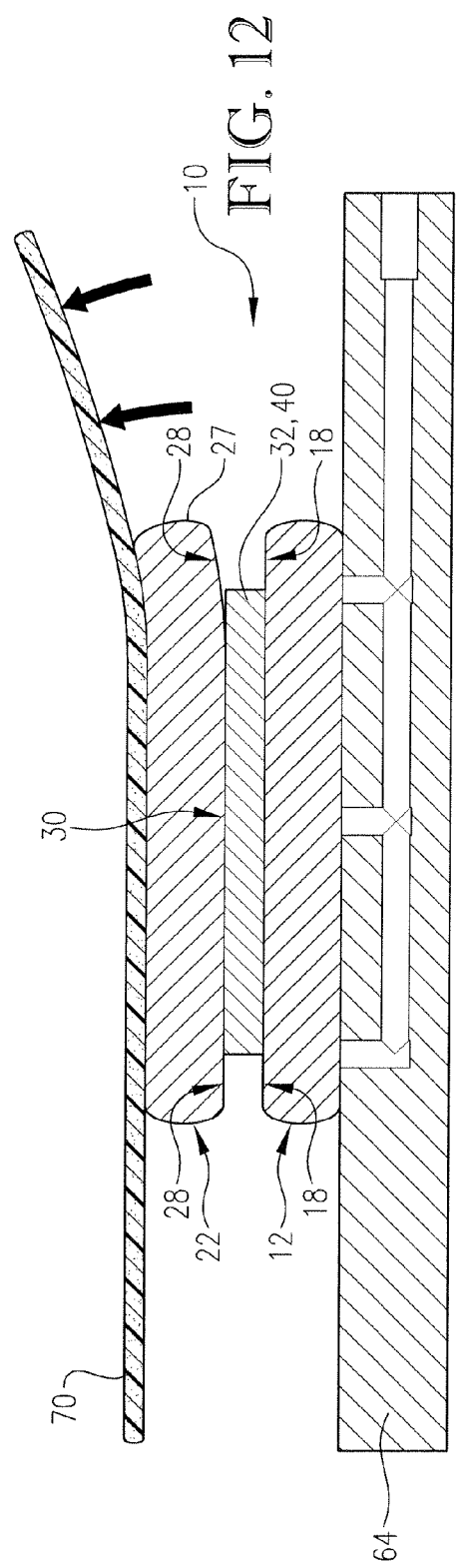
FIG. 12 is a schematic cross-section drawing of an embodiment of the invention utilizing an adhesive film and a vacuum chuck for separation of the bonded substrates.

In yet another embodiment, shown in FIG. 12, the ring clamp 42 is replaced with an adhesive film 70 that is capable of providing adequate pulling force to secure the second substrate 22 during subsequent steps. This adhesive film 70 could consist of a range of backing materials and adhesives from high bond strength to low bond strength and a variety of supporting strengths that is capable of providing adequate holding force to overcome the bond forces created in central region 30 and peripheral region 28 while providing limited support for the second substrate 22 without causing damage while still allowing it to bend to create the peeling motion. Preferred materials for the adhesive film 70 include poly vinyl chloride, polyethylene, polyolefin, and combinations thereof. The adhesive film 70 preferably has a thickness of from about 0.01 to about 3 mm, more preferably from about 0.05 to about 1 mm, and even more preferably from about 0.07 to about 0.2 mm. As with the ring clamp embodiment, an adhesive film 66 could also be used to support the first substrate 12 in the stack, as shown in FIG. 13. In either embodiment, a force is applied to a portion of the periphery of the adhesive film 70 to lift the corresponding portion of the periphery of the second substrate 22, thus removing it from the stack 10 in a peeling motion, as described. Again, the actual location of initial separation between materials in the peripheral region 28 and central region 30 of the substrate depends on the materials used and location of the surface treatment (if any), fill layer 32, edge bond 34, and/or bonding layer 40.

While the above describes the primary method of practicing the present invention, there are several alternative embodiments of the invention. For example, the above embodiments described the first substrate 12 as a device wafer and the second substrate 22 as a carrier substrate. It is also acceptable that first substrate 12 is the carrier substrate and second substrate 22 is the device wafer. In that instance, front surface 14 of first substrate 12 will not be a device surface, but rather will be a carrier surface. Also, surface 24 of second substrate 22 will not be a carrier surface, but instead will be a device surface. In other words, the fill layer 32 can be applied to the carrier rather than the device wafer, or the surface treatment 38 can be carried out on the device wafer rather than the carrier, with the same quality of stacked structure 10 being formed during the subsequent bonding step. In addition, although the embodiments of FIGS. 7-13 depict the stack 10 with the edge bond 34 or peripheral region of the bonding layer 40 removed, the edge bond 34 or peripheral region of the bonding layer 40 does not have to be removed prior to effecting separation of the wafers.

Furthermore, in lieu of the sequential application of the fill layer 32, edge bond 34, surface modification 38, and/or bonding layer 40 to the same substrate 12, it is also suitable to apply the fill layer 32, edge bond 34, surface modification 38, and/or bonding layer 40 to the first substrate 12, and the other of fill layer 32, edge bond 34, surface modification 38, and/or bonding layer 40 to the second substrate 22. The first and second substrates 12, 22 could then be pressed together in a face-to-face relationship under heat and/or pressure as described above in order to bond the two.

Finally, while in some embodiments it is preferred that the fill layer 32 does not form strong adhesive bonds with either device surface 14 or carrier surface 24, in other embodiments it may be desirable to formulate fill layer 32 so that it does not form strong adhesive bonds with only one of device surface 14 or carrier surface 24. As was also the case with the embodiments previously discussed, the substrates 12 and 22 could be reversed so that first substrate 12 would be the carrier substrate and second substrate 22 would be the device wafer. Again, in this instance, front surface 14 of first substrate 12 will not be a device surface, but rather will be a carrier surface. Also, surface 24 of second substrate 22 will not be a carrier surface, but instead will be a device surface.

It will be appreciated that the mechanism for hardening or curing these materials can be readily selected and adjusted by those of ordinary skill in the art. For example, in some embodiments, it may be desirable to use a non-curing composition for easier dissolving in later removal and cleaning processes. For each of these materials, thermoplastic or rubber-like compositions (typically having a weight average molecular weight of at least about 5,000 Daltons), resin- or rosin-type compositions (typically having a weight average molecular weight of less than about 5,000 Daltons), and mixtures of the foregoing would be suitable.

It will be appreciated that the above can be used to fabricate a number of integrated microdevices, including those selected from the group consisting of silicon-based semiconductor devices, compound semiconductor-based devices, arrays of embedded passive devices (e.g., resistors, capacitors, inductors), MEMS devices, microsensors, photonic circuit devices, light emitting diodes, heat management devices, and planar packaging substrates (e.g., interposers) to which one or more of the foregoing devices has been or will be attached.

EXAMPLES

The following examples set forth preferred methods in accordance with the invention. It is to be understood, however, that these examples are provided by way of illustration and nothing therein should be taken as a limitation upon the overall scope of the invention.

Example 1

Separation of Edge-Bonded Wafers Having Modified Center Surface Using Hand-Operated Peeler with Removal of Bonding Material from the Outer Edge In this procedure, a wafer stack is prepared according to a method of the invention and then separated using a hand-operated peel separator. Prior to adhering the two wafers together, the center contact surface of one wafer is chemically modified using a fluorinated silane solution to create an adhesive strength differential across the wafer surface. A bonding material (WaferBOND® HT10.10, available from Brewer Science, Inc., Rolla, Mo.) was dispensed onto the surface of a 200-mm silicon wafer (wafer 1) at the outer edge to form a very thin coating around the peripheral region of the wafer surface that was about 2.5 mm wide by approximately 0.5 μm thick. A surface-modifying composition was formed by diluting a fluorinated silane ((heptadecafluoro-1,1,2,2-tetrahydradecyl) trichlorosilane; Gelest Inc., Morrisville, Pa.) to a 1% solution using FC-40 solvent (perfluoro compound with primarily $C_{12}$, sold under the name FLUORINERT®, obtained from AMS Materials LLC, Jacksonville, Fla.). The resulting solution was spin coated onto the surface of wafer 1, followed by baking on a hot plate at 100° C. for 1 minute. The wafer was then rinsed with additional FC-40 solvent in a spin coater to remove unreacted silane from the center surface, and baked at 100° C. for an additional 1 minute. The bonding material prevented the surface-modifying composition from coming into contact with the edge of wafer 1 leaving it untreated while the center section was treated. The bonding material does not react with the silane, which is washed away during the rinsing step, and thus the surface of the bonding material also remains untreated. The bonding material was allowed to remain on the edge of wafer 1 for subsequent processing steps (i.e., was not removed prior to adhering the wafers).

Next, the surface of another 200-mm silicon wafer (wafer 2) was coated with the same bonding composition (WaferBOND® HT10.10) via spin coating to a layer having a thickness of about 15 μm. Wafer 2 was then baked at 110° C. for 2 minutes, followed by 160° C. for an additional 2 minutes. The coated wafers were then bonded in a face-to-face relationship under vacuum in a heated vacuum and pressure chamber at 220° C. and 15 psig for 3 minutes, so that the bonding material on wafer 1 and the bonding material on wafer 2 reflowed together to create one bonding layer.

Next, to remove the peripheral edge of the bonding layer, the bonded wafers were soaked in the bonding material's remover (WaferBOND®Remover, available from Brewer Science, Inc., Rolla, Mo.) for about 1 hour to remove the bonding material from the outer zone. The removal process is complete once the removal process reaches the fluorinated silane coating in the center of wafer 1. The removal time period will vary depending upon the thickness of the bonding layer, and can be determined empirically. In general, the thicker the bonding layer, the faster the removal rate due to the larger space between the wafers allowing for greater solvent contact. Advantageously, the treated center surface is also hydrophobic, so the solvent will also effectively stop wetting through the layer once it reaches the center. Ideally, complete removal of the edge portion of the bonding layer occurs, however, it is only necessary to cleave the layer laterally around the edge of the bonding layer (i.e., create a gap) for effective separation of the wafers. Thus, some bonding material residue on the peripheral edge of wafer 1 and wafer 2 is acceptable.

The resulting stacked wafers were then separated using a ring clamp (see FIG. 5(a)), with a handle attached to the free ends for hand-operated separation. Wafer 2 was held in place by a vacuum chuck, and the retaining ring of the ring clamp was placed circumferentially about the periphery of wafer 1, with the ends of the ring being clamped in proximal relationship to provide even pressure around the edges of the wafer (i.e., throughout the wafer's circumference). The handle attached to the ring clamp was then tilted so that the free edge of the handle lifts upwards away from the transverse plane of the stack, causing the ring clamp to deflect, thereby lifting the edge of wafer 1 up and away from wafer 2 in a peeling motion.

After the separation, the only residue of the bonding composition coating on wafer 1 was on the peripheral region (2.5 mm wide untreated surface) of wafer 1. There was no transfer of bonding material to the treated center surface of wafer 1. The bonding material coating remained on wafer 2 in the center, with residue at the peripheral region. Either wafer in this example could be considered the device wafer or the carrier wafer.

Example 2

Separation of Adhered Wafer Stack Using Hand-Operated Peel Separator

In this procedure, a wafer stack is prepared according to another method of the invention and then separated using a hand-operated peel separator. Prior to adhering the two wafers together, the center surface of one silicon wafer is chemically modified using a fluorinated silane solution to create an adhesive strength differential across the wafer surface. To modify the center surface of the wafer, the edge of the wafer was first masked using a coating of an epoxy-based photoresist (SU-8 2002, Microchem, Newton, Mass.). The photoresist composition was dispensed onto the outer edge surface of a 200-mm silicon wafer (wafer 1) to coat a peripheral ring-shaped section of the wafer surface that was about 2.5 mm wide.

Next, a fluorinated silane ((hepta-decafluoro-1,1,2,2-tetrahydradecyl)trichlorosilane; Gelest, Morrisville, Pa.) was diluted to a 1% solution using FC-40 solvent (perfluoro-alkyl compound with primarily $C_{12}$, sold under the name FLUORINERT®; obtained from AMS Materials LLC, Jackson, Fla.). The diluted solution was spin coated onto the surface of wafer 1. The wafer was baked on a hot plate at 100° C. for 1 minute, and then rinsed with FC-40 solvent in a spin coater, followed by baking at 100° C. for an additional 1 minute. The epoxy-based photoresist mask was then removed using acetone in a spin coater to expose the untreated edge of the wafer. Thus, only the center portion of wafer 1 was treated with the fluorinated silane solution and rendered "non-stick," while the edges of the wafer retained a bondable surface.

The surface of another 200-mm silicon wafer (wafer 2) was coated with a bonding composition (WaferBOND® HT10.10) via spin coating. This wafer was then baked at 110° C. for 2 minutes, followed by 160° C. for 2 minutes. The coated wafers were then bonded in a face-to-face relationship under vacuum in a heated vacuum and pressure chamber at 220° C. and 10 psig for 3 minutes.

Next, the resulting stacked wafers were then separated using a ring clamp (see FIG. 5(a)), with a handle attached to the free ends for hand-operated separation. In this procedure, the peripheral region of the bonding composition is not removed prior to separation. Wafer 2 was held in place by a vacuum chuck, and the retaining ring of the ring clamp was placed circumferentially about the periphery of wafer 1, with the ends of the ring being clamped together to provide even pressure around the edges of the wafer (i.e., throughout the wafer's circumference). The handle attached to the ring clamp was then tilted so that the free edge of the handle lifts upwards away from the transverse plane of the stack, causing the ring clamp to deflect, thereby lifting the edge of wafer 1 up and away from wafer 2 in a peeling motion. After the separation, only about a 2.5 mm wide ring of the bonding composition coating transferred to the edge of wafer 1, while the rest of bonding composition remained on wafer 2. That is, the bonding composition only adhered to the outer edge surface of wafer 1 and did not adhere to the chemically treated center surface of wafer 1. Either wafer in this example could be considered the device wafer or the carrier wafer.

Example 3

Hand-Operated Peel Separator Used to Separate Wafer Stack with Center Contact Surface Coated with Release Material In this procedure, a wafer stack is prepared according to another method of the invention and then again separated using a hand-operated peel separator. Prior to adhering the two wafers together, the center surface of one wafer is coated with a release material to create an adhesive strength differential across the wafer surface-center layer interface. First, a negative epoxy-based photoresist (sold under the name SU-8 2010; obtained from MicroChem) was spin coated onto the entire surface of a 200-mm glass wafer (wafer 1), followed by baking at 110° C. for 2 minutes to effect solvent removal. A Teflon® AF solution (Teflon® AF2400 in FC-40; obtained from DuPont) was then spin coated over the photoresist layer to create a nonstick layer. Next, FC-40 solvent was dispensed onto the surface of the wafer at the outer edge to remove about a 1-3 mm wide section of the Teflon® AF coating from the peripheral edge of the wafer surface, followed by baking 110° C. for 2 minutes to remove the solvent.

The wafer was then bonded in a face-to-face relationship with a blank, 200-mm silicon wafer (wafer 2) under vacuum in a heated vacuum and pressure chamber at 120° C. and 10 psig for 3 minutes. During this step, the photoresist layer reflows around the Teflon® layer to fill the gaps on the outer edge of the wafers where the Teflon® layer was removed above, thus bonding to the peripheral edge of wafer 2. The bonded wafers were then exposed to broadband UV light from the outer side of the glass wafer, followed by baking at 120° C. for 2 minutes to crosslink and cure the SU-8 2010 coating.

The resulting stacked wafers were then separated using a ring clamp (see FIG. 5(a)), with a handle attached to the free ends for hand-operated separation. Wafer 2 was held in place by a vacuum chuck, and the retaining ring of the ring clamp was placed circumferentially about the periphery of wafer 1, with the ends of the ring being clamped together to provide even pressure around the edges of the wafer (i.e., throughout the wafer's circumference). The handle attached to the ring clamp was then lifted, causing the ring clamp to deflect, thereby lifting the edge of wafer 1 up and away from wafer 2 in a peeling motion, as described in Example 1. In this procedure, the peripheral region of the bonding composition is not removed prior to separation. Rather, the photoresist layer is laterally cleaved at the initial separation point as a natural consequence of the ring clamp deflection motion, so that some of the photoresist material remained on the glass wafer (wafer 1), while the portion of the layer was transferred to the silicon wafer (wafer 2) in the untreated region. After separation, the wafer 2 had only a ring of material at the outer 1-3 mm, while there was no material transfer in the center region of the wafer that had been in contact with the Teflon® release layer of wafer 1. Either wafer in this example could be considered the device wafer or the carrier wafer.

Example 4

Hand-Operated Peel Separator Used to Separate Wafer Stack with Center Surface Filled with Material Having Low Adhesion to Either Substrate In this procedure, a wafer stack is prepared according to another method of the invention and then again separated using a hand-operated peel separator. Prior to adhering the two wafers together, the center surface of one wafer is coated with a release material to create an adhesive strength differential across the wafer surface. The Teflon® AF solution used in Example 3 was spin coated onto the surface of a 200-mm silicon wafer (wafer 1) to form a coating with a thickness of about 10 μm. Next, FC-40 solvent was dispensed onto the surface of the wafer at the outer edge to remove about a 3-5 mm wide section of the Teflon® AF coating from the wafer surface. The wafer was then baked at 110° C. for 2 minutes. Next, the edge of the wafer was coated with WaferBOND® HT 10.10 bonding composition via spin coating, with the material only being dispensed at the edge to form a layer of bonding material around the peripheral region of the wafer surface that was about 3-5 mm wide by approximately 10 μm thick. Thus, the Teflon® coating and bonding material formed a single, non-uniform layer of material across the wafer surface. The wafer was then bonded in a face-to-face relationship with a blank, 200-mm silicon wafer (wafer 2) under vacuum in a heated vacuum and pressure chamber at 220° C. and 10 psig for 2 minutes.

The resulting stacked wafers were then separated using a ring clamp (see FIG. 5(a)), with a handle attached to the free ends for hand-operated separation. Wafer 2 was held in place by a vacuum chuck, and the retaining ring of the ring clamp was placed circumferentially about the periphery of wafer 1, with the ends of the ring being clamped together to provide even pressure around the edges of the wafer (i.e., throughout the wafer's circumference). The handle attached to the ring clamp was then lifted, causing the ring clamp to deflect, thereby lifting the edge of wafer 1 up and away from wafer 2 in a peeling motion, as described in Example 1. In this procedure, the peripheral region of the bonding composition is not removed prior to separation. After separation, wafer 2 had only a ring of the bonding material on the outer 3-5 mm, while there was no material transfer in the center. Wafer 1 had a ring of bonding material on the outer 3-5 mm and the Teflon® AF coating remained in the center. The bonding material had been cleaved through its cross section and was split between the two wafers. Either wafer in this example could be considered the device wafer or the carrier wafer.

We claim:

1. A temporary bonding method comprising:
   providing a stack comprising:
   a first substrate having a back surface and a device surface, said device surface having a peripheral region and a central region;
   a second substrate bonded to said first substrate, said second substrate having a carrier surface, a backside surface, and an outermost edge defining the periphery of the second substrate, said carrier surface having a peripheral region and a central region and comprising a surface modification, said carrier surface comprising surface-modified portions and non-modified portions, wherein said surface-modified portions have a low bonding surface; and
   a uniform bonding layer between said first substrate and said second substrate, said bonding layer being formed from a polymeric adhesive; and
   separating said first and second substrate using a peeling motion by applying a force to a portion of the periphery of said second substrate causing said second substrate to bend at an angle away from the stack, thereby separating said first substrate and second substrate.

2. The method of claim 1, said bonding layer being bonded to said device surface and to said peripheral region of said carrier surface, wherein said bonding layer and said central region of said carrier surface comprise a low bonding interface therebetween.

3. The method of claim 2, wherein said low bonding interface comprises surface modification of said central region of said carrier surface.

4. The method of claim 1, further comprising mechanically or chemically disrupting said bonding layer adjacent said peripheral regions to remove at least a portion of said bonding layer prior to said separating.

5. The method of claim 1, said bonding layer being bonded to said device surface and to non-modified portions of said carrier surface, wherein said bonding layer and said surface-modified portions of said carrier surface comprise a low bonding interface therebetween.

6. The method of claim 1, wherein said device surface comprises an array of devices selected from the group consisting of integrated circuits; MEMS; microsensors; power semiconductors; light-emitting diodes; photonic circuits; interposers; embedded passive devices; and microdevices fabricated on or from silicon, silicon-germanium, gallium arsenide, and gallium nitride.

7. The method of claim 1, said device surface comprising at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

8. The method of claim 1, wherein said second substrate comprises a material selected from the group consisting of silicon, sapphire, quartz, metal, glass, and ceramics.

9. The method of claim 1, further comprising subjecting said stack to processing selected from the group consisting of back-grinding, chemical-mechanical polishing, etching, metal and dielectric deposition, patterning, passivation, annealing, and combinations thereof, prior to separating said first and second substrates.

10. The method of claim 1, wherein said separating is carried out using a ring clamp having a planar body with a substantially circular shape defining the periphery of said ring clamp and a central opening, said ring clamp being secured about the periphery of the second substrate, and wherein said force is applied to only a portion of the periphery of said ring clamp thereby lifting the corresponding portion of the periphery of the second substrate away from the stack in said peeling motion.

11. The method of claim 10, said body comprising:
an annular interior sidewall;
an annular exterior sidewall;
a top surface extending between the interior sidewall and the exterior sidewall;
a wafer-engaging surface extending outwardly from the interior sidewall, said wafer-engaging surface terminating at a point in the body, that is spaced from the exterior sidewall; and
an inwardly extending annular ridge, which slopes inward from said point, and away from the wafer-engaging surface,
wherein said wafer-engaging surface and annular ridge cooperatively form an annular wafer-receiving groove, at least a portion of the periphery of said second substrate being received in said groove.

12. The method of claim 11, wherein said body is in the form of a split ring clamp having two free ends.

13. The method of claim 12, wherein said ring clamp is secured about the periphery of said second substrate by:

moving said free ends away from one another, thereby enlarging the central opening of said body;
placing said ring clamp about the periphery of the second substrate; and
drawing said free ends toward one another to compressively engage the second substrate, prior to said separating,
wherein the annular ridge of said ring clamp terminates in a free edge and has a sloped shoulder surface extending between the free edge of the ridge and the point where the wafer-engaging surface terminates in the body, the backside surface of said second substrate being engaged by the wafer-engaging surface of the body and the outermost edge and peripheral region of the second substrate being engaged by the shoulder and free edge of the ridge.

14. The method of claim 13, wherein said ring clamp engages at least about 1° of the periphery of said second substrate.

15. The method of claim 1, wherein the first substrate of said stack is secured to a chuck prior to separating said substrates.

16. The method of claim 15, said first substrate being secured to said chuck via an electrostatic force, a vacuum force, magnetic force, mechanical force, physical restraint, or a layer of adhesive film between said chuck and said first substrate.

17. The method of claim 15, wherein said chuck is moved away from the second substrate during said separating.

18. The method of claim 1, wherein said separating is carried out using a flexible chuck having a periphery, said second substrate being secured to said flexible chuck, said force being applied to only a portion of the periphery of said flexible chuck thereby lifting the corresponding portion of the periphery of said second substrate away from the stack in said peeling motion.

19. The method of claim 1, wherein said separating is carried out using an adhesive film having a periphery, said second substrate being secured to said adhesive film, said force being applied to only a portion of the periphery of said adhesive film thereby lifting the corresponding portion of the periphery of the second substrate away from the stack in said peeling motion.

20. The method of claim 1, said surface-modified portions comprising a pattern.

21. The method of claim 20, wherein said pattern is selected from the group consisting of grids, lines, and shapes.

22. The method of claim 1, wherein the bonding interface between said bonding layer and said carrier surface has high adhesive strength regions and low adhesive strength regions.

23. The method of claim 1, wherein said polymeric adhesive has an adhesion strength of from about 80 psig to about 250 psig.

24. The method of claim 11, wherein said ring clamp does not contact said first substrate.

25. A temporary bonding method comprising:
providing a stack comprising:
a first substrate having a back surface and a device surface, said device surface having a peripheral region and a central region;
a second substrate bonded to said first substrate, said second substrate having a carrier surface, a backside surface, and an outermost edge defining the periphery of the second substrate, said carrier surface having a peripheral region and a central region; and
an intermediate layer comprising a uniform bonding layer between said first substrate and said second substrate, said bonding layer being formed from resins or polymers that exhibit a high adhesion strength to semiconductor materials, glass, and metals, said intermediate layer being bonded to said device surface and to said peripheral region of said carrier surface, wherein said intermediate layer and said central region of said carrier surface comprise a low bonding interface therebetween, wherein said low bonding interface comprises surface modification of said central region of said carrier surface; and separating said first and second substrate using a peeling motion by applying a force to a portion of the periphery of said second substrate causing said second substrate to bend at an angle away from the stack, thereby separating said first substrate and second substrate.

26. The method of claim 25, wherein said resins or polymers have an adhesion strength of from about 80 psig to about 250 psig.

27. A temporary bonding method comprising:
providing a stack comprising:
a first substrate having a back surface and a device surface, said device surface having a peripheral region and a central region;
a second substrate bonded to said first substrate, said second substrate having a carrier surface, a backside surface, and an outermost edge defining the periphery of the second substrate, said carrier surface having a peripheral region and a central region and comprising a surface modification, said carrier surface comprising surface-modified portions and non-modified portions, wherein said surface-modified portions have a low bonding surface; and
separating said first and second substrate using a peeling motion by applying a force to a portion of the periphery of said second substrate causing said second substrate to bend at an angle away from the stack, thereby separating said first substrate and second substrate
wherein said separating is carried out using a ring clamp having a planar body with a substantially circular shape defining the periphery of said ring clamp and a central opening, said ring clamp being secured about the periphery of the second substrate, and wherein said force is applied to only a portion of the periphery of said ring clamp thereby lifting the corresponding portion of the periphery of the second substrate away from the stack in said peeling motion.

28. The method of claim 27, said body comprising:
an annular interior sidewall;
an annular exterior sidewall;
a top surface extending between the interior sidewall and the exterior sidewall;
a wafer-engaging surface extending outwardly from the interior sidewall, said wafer-engaging surface terminating at a point in the body that is spaced from the exterior sidewall; and
an inwardly extending annular ridge, which slopes inward from said point, and away from the wafer-engaging surface,
wherein said wafer-engaging surface and annular ridge cooperatively form an annular wafer-receiving groove, at least a portion of the periphery of said second substrate being received in said groove.

29. The method of claim 28, wherein said body is in the form of a split ring clamp having two free ends.

30. The method of claim 29, wherein said ring clamp is secured about the periphery of said second substrate by:
moving said free ends away from one another, thereby enlarging the central opening of said body;
placing said ring clamp about the periphery of the second substrate; and
drawing said free ends toward one another to compressively engage the second substrate, prior to said separating,
wherein the annular ridge of said ring clamp terminates in a free edge and has a sloped shoulder surface extending between the free edge of the ridge and the point where the wafer-engaging surface terminates in the body, the backside surface of said second substrate being engaged by the wafer-engaging surface of the body and the outermost edge and peripheral region of the second substrate being engaged by the shoulder and free edge of the ridge.

31. The method of claim 30, wherein said ring clamp engages at least about 1° of the periphery of said second substrate.

32. The method of claim 27, wherein said ring clamp does not contact said first substrate.

* * * * *